(12) United States Patent
Takekida et al.

(10) Patent No.: US 11,887,926 B2
(45) Date of Patent: Jan. 30, 2024

(54) SEMICONDUCTOR STORAGE DEVICE WITH INSULATING LAYERS FOR ETCHING STOP

(71) Applicant: KIOXIA CORPORATION, Tokyo (JP)

(72) Inventors: Hideto Takekida, Nagoya Aichi (JP); Shotaro Kuzukawa, Yokkaichi Mie (JP); Kazuhiro Nojima, Mie Mie (JP)

(73) Assignee: Kioxia Corporation, Tokyo (JP)

( * ) Notice: Subject to any disclaimer, the term of this patent is extended or adjusted under 35 U.S.C. 154(b) by 296 days.

(21) Appl. No.: 17/188,423

(22) Filed: Mar. 1, 2021

(65) Prior Publication Data
US 2022/0068804 A1    Mar. 3, 2022

(30) Foreign Application Priority Data

Aug. 31, 2020 (JP) ................................ 2020-146444

(51) Int. Cl.
| | |
|---|---|
| H01L 23/522 | (2006.01) |
| H10B 41/27 | (2023.01) |
| H10B 43/27 | (2023.01) |
| H10B 43/40 | (2023.01) |
| H10B 43/10 | (2023.01) |

(52) U.S. Cl.
CPC ......... *H01L 23/5226* (2013.01); *H10B 41/27* (2023.02); *H10B 43/10* (2023.02); *H10B 43/27* (2023.02); *H10B 43/40* (2023.02)

(58) Field of Classification Search
CPC .......... H01L 23/5226; H01L 27/11582; H01L 23/52; H10B 43/27; H10B 41/27
See application file for complete search history.

(56) References Cited

U.S. PATENT DOCUMENTS

| | | |
|---|---|---|
| 2018/0269277 A1 | 9/2018 | Miyagawa et al. |
| 2019/0296041 A1 | 9/2019 | Yamasaka et al. |
| 2020/0075615 A1 | 3/2020 | Oga et al. |
| 2020/0075618 A1 | 3/2020 | Oike |
| 2020/0212066 A1 | 7/2020 | Nakanishi et al. |
| 2020/0258901 A1* | 8/2020 | Choi ...................... H10B 43/40 |
| 2021/0366920 A1* | 11/2021 | Tokita ................ H01L 25/0657 |

FOREIGN PATENT DOCUMENTS

| | | |
|---|---|---|
| JP | 2018-026518 A | 2/2018 |
| TW | 201836070 A | 10/2018 |
| TW | 201941407 A | 10/2019 |
| TW | 202011529 A | 3/2020 |

* cited by examiner

*Primary Examiner* — Kretelia Graham
*Assistant Examiner* — Adin Hrnjic
(74) *Attorney, Agent, or Firm* — Kim & Stewart LLP

(57) ABSTRACT

A semiconductor storage device includes a substrate and a memory cell array. The memory cell array is above the substrate in a first direction. The memory cell array includes first to third regions arranged in a second direction. The memory cell array comprises a first stack in the first and third regions, first and second semiconductor layers extending through the first stack in the first and third regions, respectively, a second stack in the second region, a first contact extending through the second stack, a fourth insulating layer extending in the first and second directions in the second region, and a fifth insulating layer extending in the first direction and a third direction in the second region. A distance from a bottom end of the fourth insulating layer to the substrate is different from a distance from a bottom end of the fifth insulating layer to the substrate.

20 Claims, 22 Drawing Sheets

SEMICONDUCTOR STORAGE DEVICE WITH INSULATING LAYERS FOR ETCHING STOP

CROSS-REFERENCE TO RELATED APPLICATION(S)

This application is based upon and claims the benefit of priority from Japanese Patent Application No. 2020-146444, filed Aug. 31, 2020, the entire contents of which are incorporated herein by reference.

FIELD

Embodiments described herein relate generally to a semiconductor storage device.

BACKGROUND

A semiconductor storage device of one type includes a semiconductor substrate, a plurality of conductive layers stacked in a direction intersecting with a surface of the semiconductor substrate, a semiconductor pillar extending in the direction intersecting with the surface of the semiconductor substrate and facing the plurality of conductive layers, and a gate insulating film provided between the conductive layers and the semiconductor pillar.

DETAILED DESCRIPTION

Figure 1:
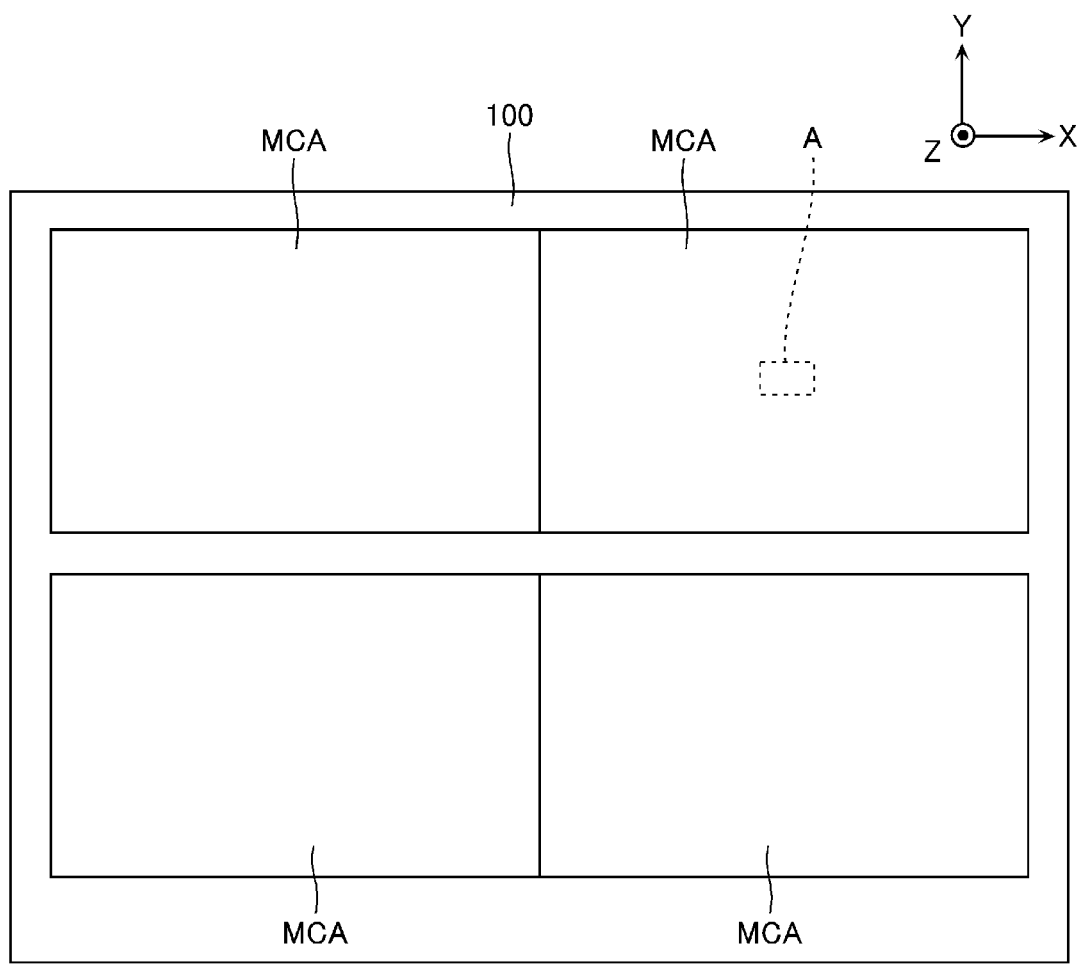
FIG. 1 illustrates a schematic plan view of a semiconductor storage device according to a first embodiment.

Embodiments provide a compact semiconductor storage device.

According to an embodiment, a semiconductor storage device includes a semiconductor substrate and a memory cell array. The memory cell array is on the semiconductor substrate spaced away from a surface of the semiconductor substrate in a first direction. The memory cell array includes a first region, a second region, and a third region arranged in this order along a second direction parallel to the surface of the semiconductor substrate. The memory cell array comprises a first stack including a plurality of first conductive layers and a plurality of first insulating layers alternately stacked in the first direction in the first and third regions, a first semiconductor layer extending through the first stack in the first direction in the first region, a second semiconductor layer extending through the first stack in the first direction in the third region, a second stack including a plurality of second insulating layers and a plurality of third insulating layers alternately stacked in the first direction in the second region, a first contact extending through the second stack in the first direction in the second region, a lower end of the first contact being closer to the semiconductor substrate than is a lower end of the first stack, and an upper end of the first contact being farther from the semiconductor substrate than is an upper end of the first stack, a fourth insulating layer extending in the first and second directions in the second region and adjacent to a first side surface of the second stack facing a third direction parallel to the surface of the semiconductor substrate, and a fifth insulating layer extending in the first and third directions in the second region and adjacent to a second side surface of the second stack facing the second direction. A first distance from a bottom end of the fourth insulating layer to the semiconductor substrate is different from a second distance from a bottom end of the fifth insulating layer to the semiconductor substrate.

A semiconductor storage device according to certain example embodiments will be described with reference to the drawings. The following embodiments are merely examples, and are not intended to limit the disclosure.

In the present specification, a one direction parallel to a surface of a semiconductor substrate is referred to as an X direction, another direction that is parallel to the surface of the semiconductor substrate and is perpendicular to the X direction is referred to as a Y direction, and a direction orthogonal to the surface of the semiconductor substrate is referred to as a Z direction.

In the present specification, a direction along a predetermined plane may be referred to as a first direction, another direction along the predetermined plane intersecting the first direction may be referred to as a second direction, and a direction intersecting the predetermined plane may be referred to as a third direction. The first direction, the second direction, and the third direction may or may not correspond to any one of the X direction, the Y direction, and the Z direction.

In the present specification, expressions such as "upper" and "lower" are generally based on distance from the semiconductor substrate. For example, a direction going away from the semiconductor substrate along the Z direction is referred to as "upper," "upward," or the like, and a direction approaching the semiconductor substrate along the Z direction is referred to as "lower" or the like. Reference to a lower surface or a lower end portion of a certain structure means a surface or an end portion of the structure on a semiconductor substrate side, and an upper surface or an upper end portion of the certain structure refers to a surface or an end portion of the structure on a side opposite to the semiconductor substrate. A surface intersecting the X direction or the Y direction may be referred to as a side surface or the like.

In the present specification, when a first component is said to be "electrically connected" to a second component, the first component may be directly connected to the second component or the first component may be connected to the second component via a wiring, a semiconductor member, a transistor, or the like. For example, when three transistors are connected in series, the first transistor is "electrically connected" to the third transistor even when the second transistor is in an OFF state.

In the present specification, when a first component is said to be "connected between" a second component and a third component, this generally means that the first component, the second component, and the third component are connected in series with each other, and the first component is thus provided in current path between the second component and the third component.

In the present specification, when a circuit or component "conducts" or "connects" two wirings or the like this generally means that the circuit or component includes a transistor or another switch-like element in a current path between the two wirings (or the like), and the transistor or the switch-like element is in an ON state.

FIRST EMBODIMENT

A configuration of a semiconductor storage device according to a first embodiment will be described below with reference to the drawings. The following drawings are schematic and some components, aspects, or configurations may be omitted from the depictions for convenience of description.

Structure

Figure 2:
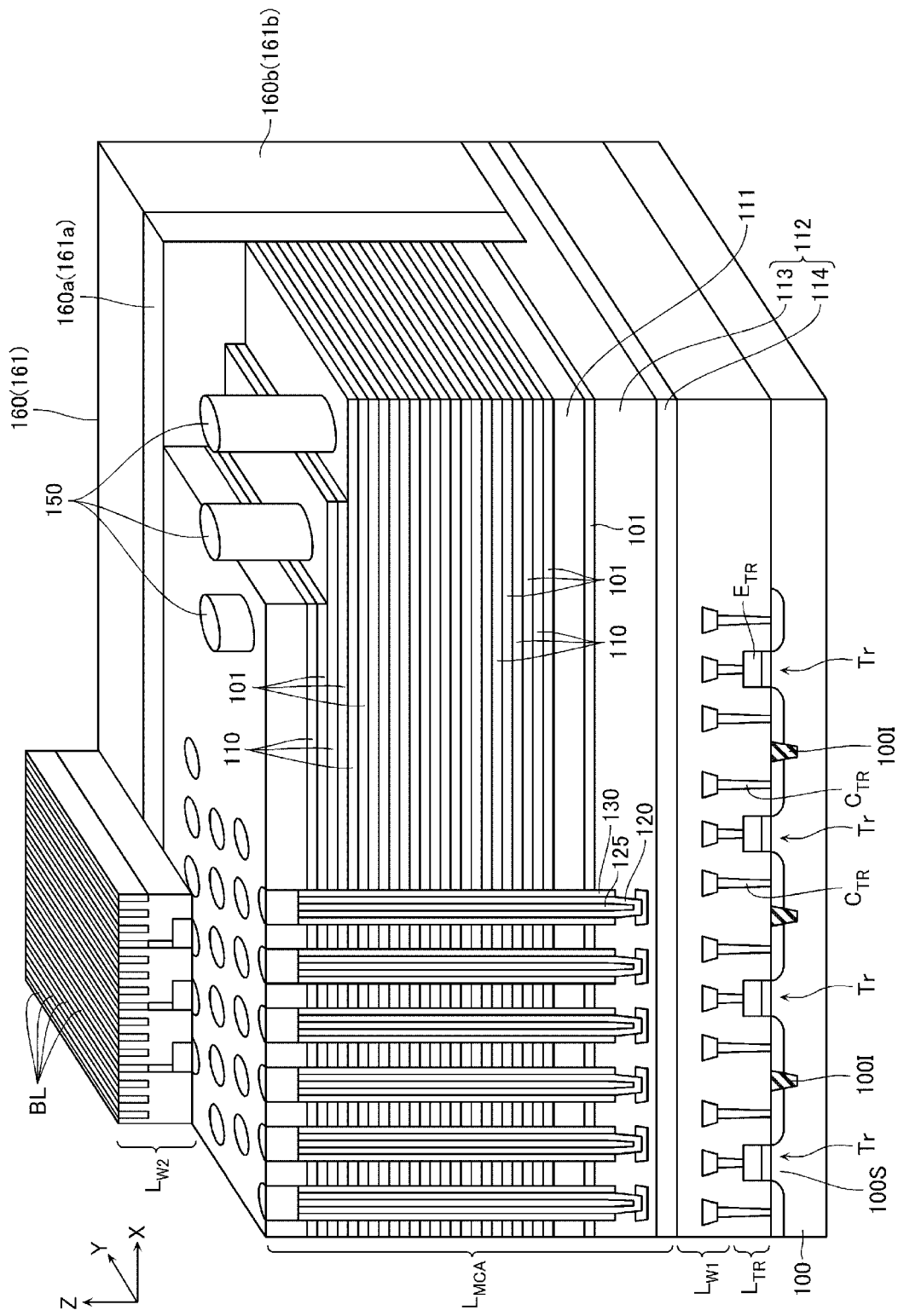
FIG. 2 illustrates a partial perspective view of a broken semiconductor storage device according to the first embodiment.
Figure 3:
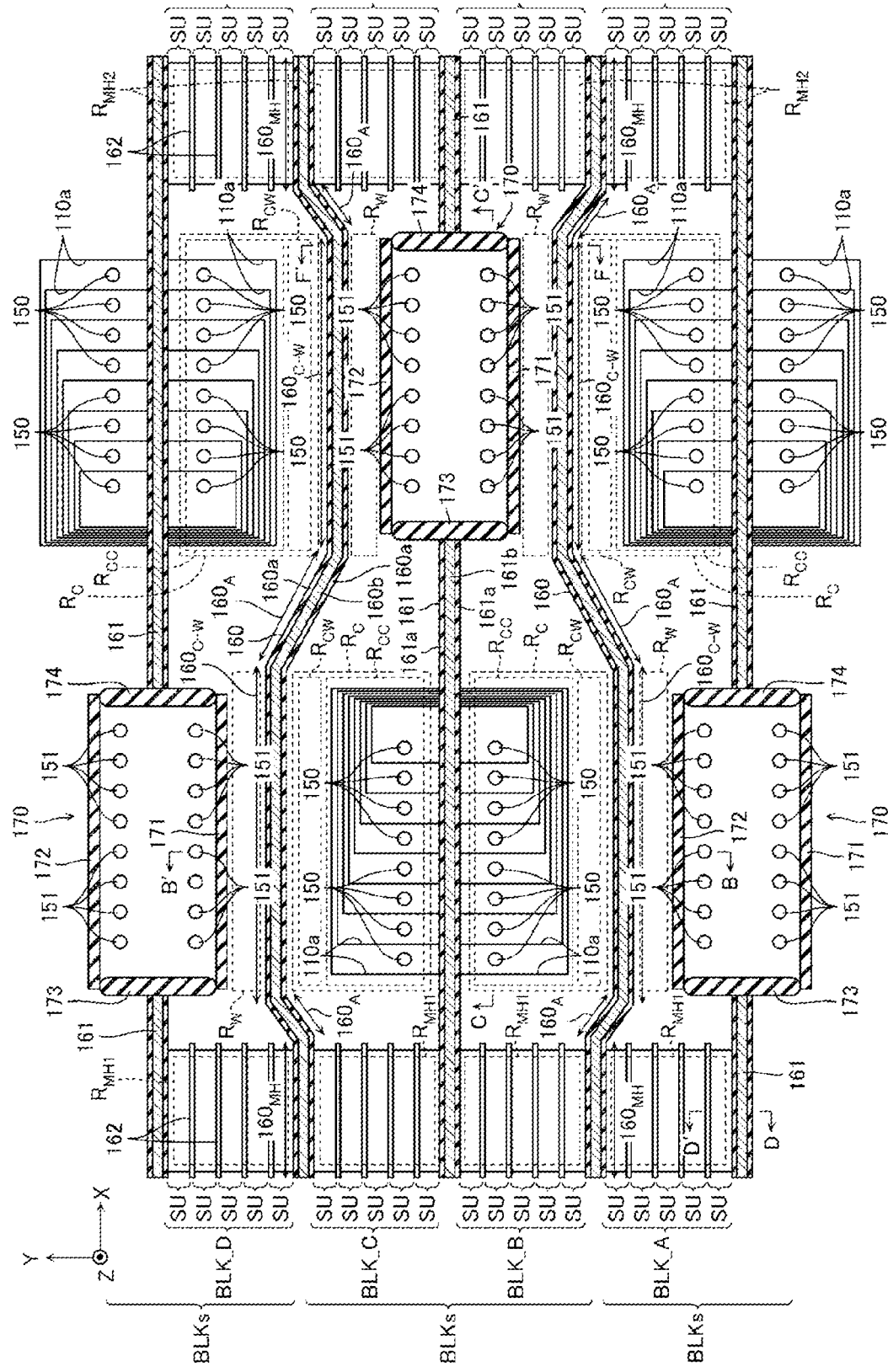
FIG. 3 illustrates a schematic enlarged cross-sectional view of a portion indicated by A in FIG. 1.
Figure 4:
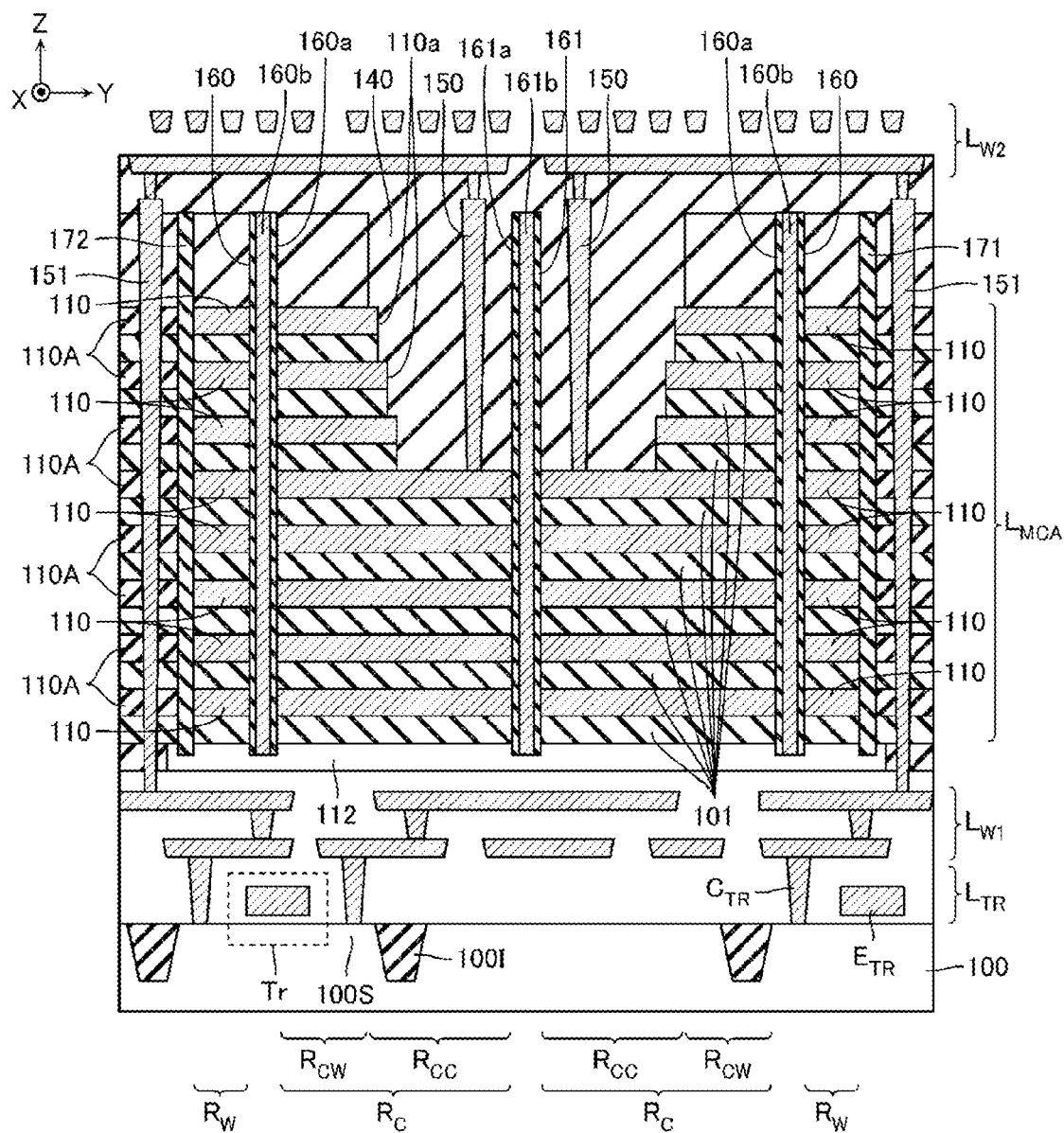
FIG. 4 illustrates a schematic cross-sectional view of a structure shown in FIG. 3 cut along a B-B' line and viewed in a direction of an arrow.
Figure 5:
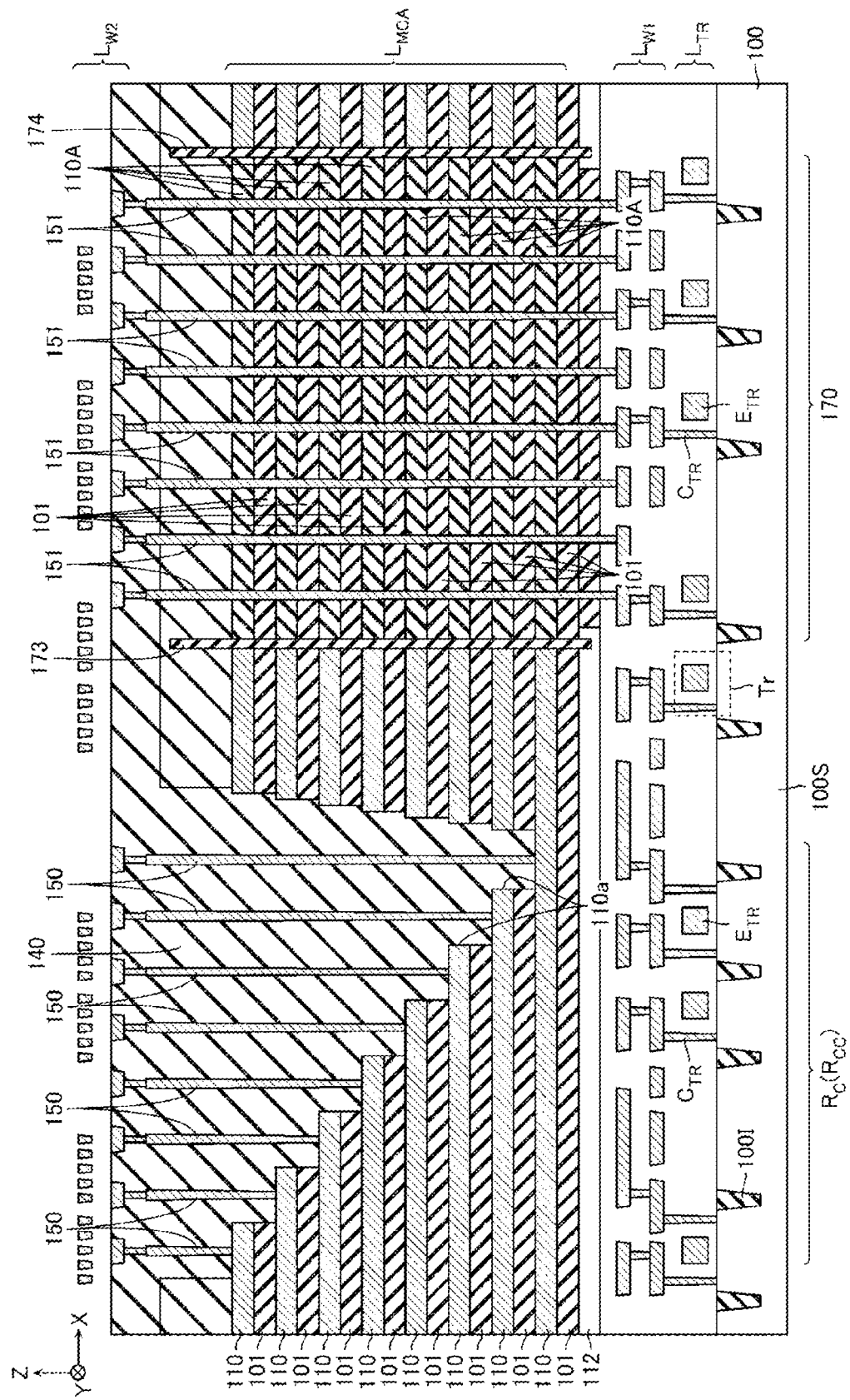
FIG. 5 illustrates a schematic cross-sectional view of a structure shown in FIG. 3 cut along a C-C' line and viewed in a direction of an arrow.
Figure 6:
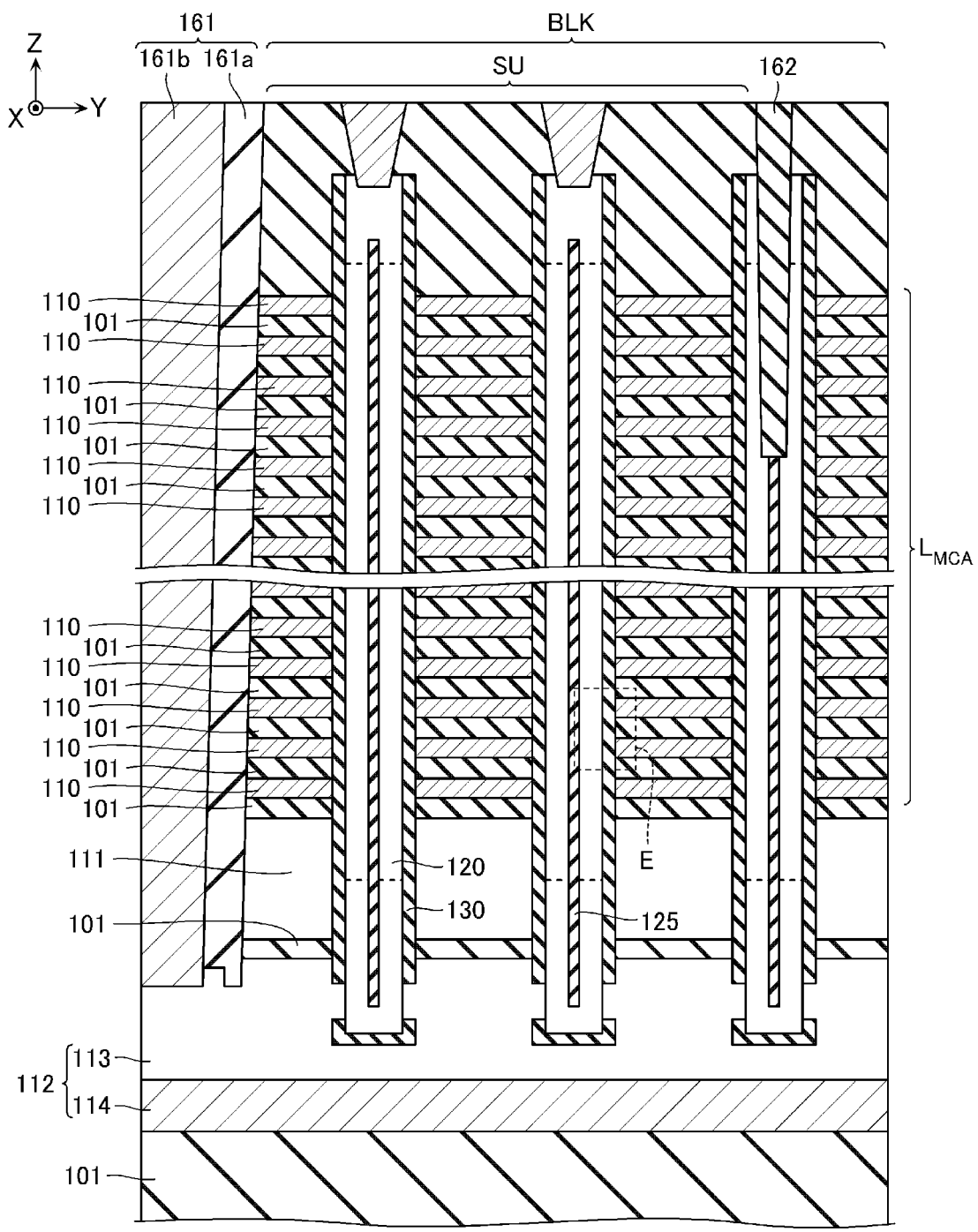
FIG. 6 illustrates a schematic cross-sectional view of a structure shown in FIG. 3 cut along a D-D' line and viewed in a direction of an arrow.
Figure 7:
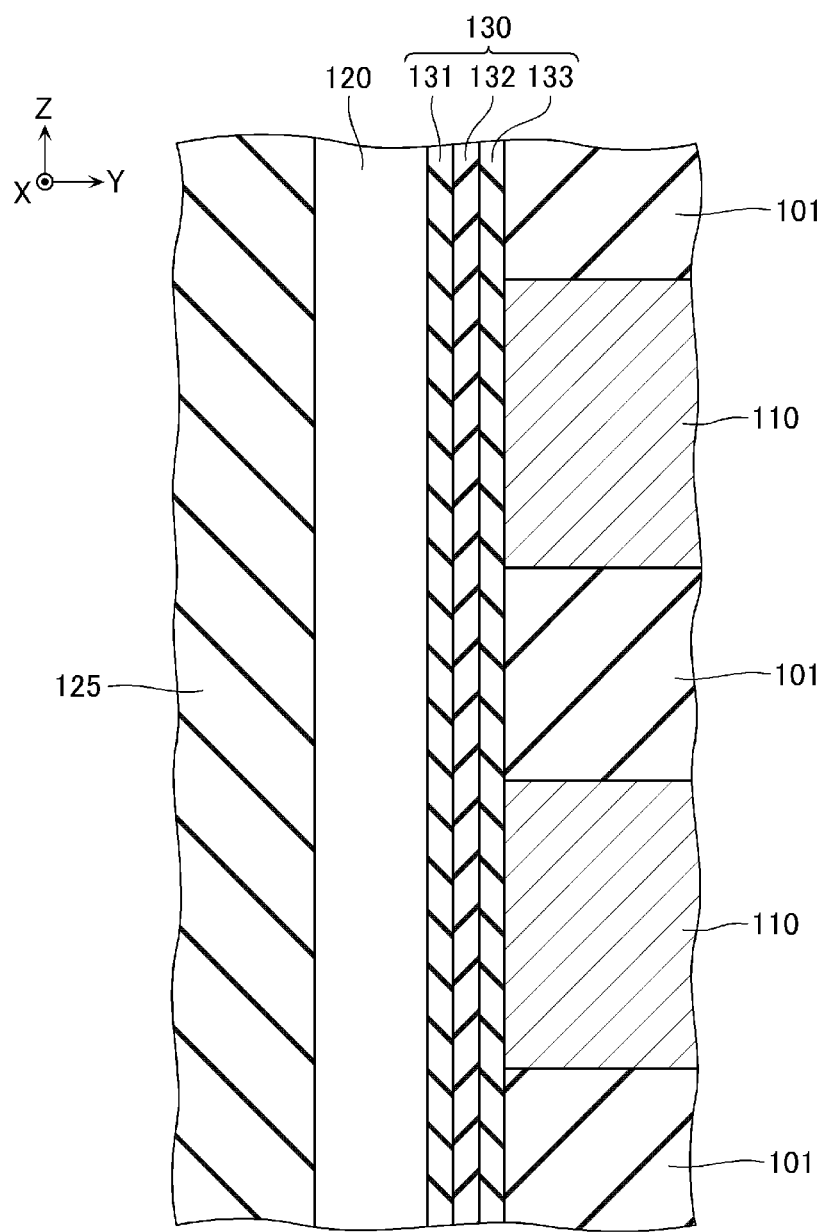
FIG. 7 illustrates a schematic enlarged view of a portion indicated by E in FIG. 6.
Figure 8:
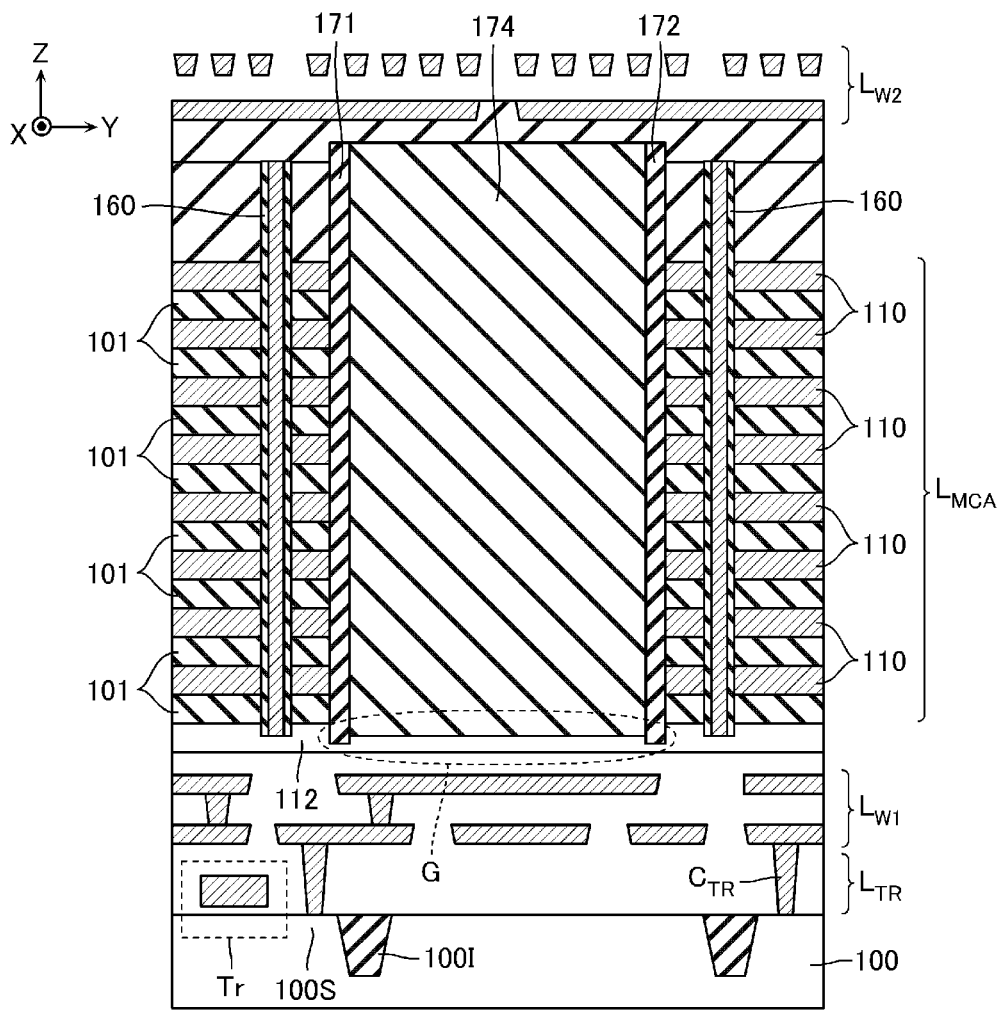
FIG. 8 illustrates a schematic cross-sectional view of a structure shown in FIG. 3 cut along an F-F' line and viewed in a direction of an arrow.
Figure 9:
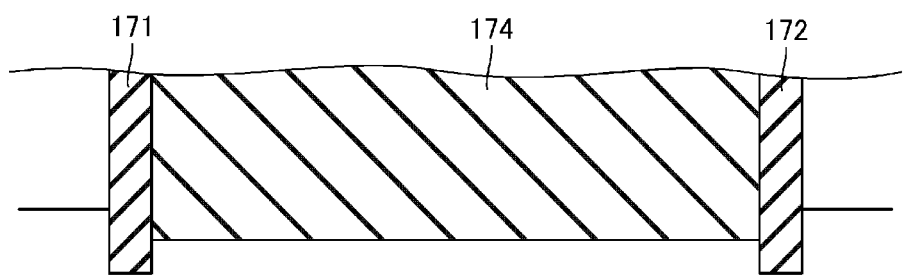
FIG. 9 illustrates an enlarged cross-sectional view of a portion indicated by G in FIG. 8.
Figure 10:
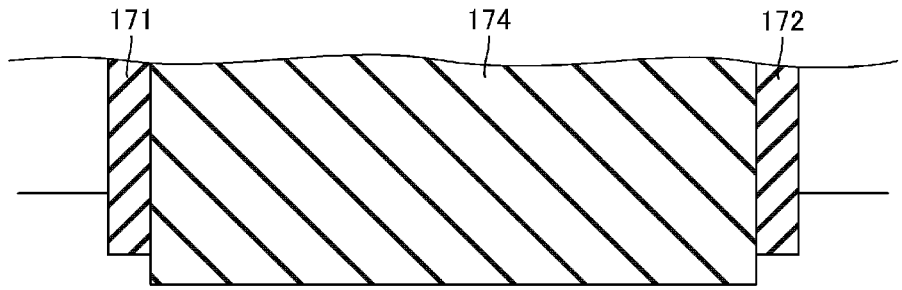
FIG. 10 illustrates an enlarged cross-sectional view of another example of the portion shown by G in FIG. 8.

FIG. 1 illustrates a schematic plan view of the semiconductor storage device according to the first embodiment. FIG. 2 illustrates a partial perspective view of a broken semiconductor storage device according to the first embodiment. FIG. 3 illustrates a schematic enlarged cross-sectional view of a portion indicated by A in FIG. 1, and shows a configuration in a memory cell array layer. FIG. 4 illustrates a schematic cross-sectional view of a structure shown in FIG. 3 cut along a B-B' line and viewed in a direction of an arrow. FIG. 5 illustrates a schematic cross-sectional view of a structure shown in FIG. 3 cut along a C-C' line and viewed in a direction of an arrow. FIG. 6 illustrates a schematic cross-sectional view of a structure shown in FIG. 3 cut along a D-D' line and viewed in a direction of an arrow. FIG. 7 illustrates a schematic enlarged view of a portion indicated by E in FIG. 6. FIG. 8 illustrates a schematic cross-sectional view of a structure shown in FIG. 3 cut along an F-F' line and viewed in a direction of an arrow. FIG. 9 illustrates an enlarged cross-sectional view of a portion indicated by G in FIG. 8. FIG. 10 illustrates an enlarged cross-sectional view of another example of the portion shown by G in FIG. 8.

The semiconductor storage device according to the first embodiment includes a semiconductor substrate 100, for example, as shown in FIG. 1. In the illustrated example, four memory cell arrays MCA arranged in the X direction and the Y direction are provided in the semiconductor substrate 100.

Structure of Semiconductor Storage Device

For example, as shown in FIGS. 2, 4, and 5, the semiconductor storage device according to the first embodiment includes the semiconductor substrate 100, a transistor layer $L_{TR}$ provided on the semiconductor substrate 100, a wiring layer $L_{W1}$ provided above the transistor layer $L_{TR}$, a memory cell array layer $L_{MCA}$ provided above the wiring layer $L_{W1}$, and a wiring layer $L_{W2}$ provided above the memory cell array layer $L_{MCA}$.

Structure of Semiconductor Substrate 100

The semiconductor substrate 100 is, for example, a semiconductor substrate made of P-type silicon (Si) containing P-type impurities such as boron (B). For example, as shown in FIGS. 2 to 4, a semiconductor substrate region 100S and an insulating region 100I are formed on a surface of the semiconductor substrate 100.

Structure of Transistor Layer $L_{TR}$

The transistor layer $L_{TR}$ includes a plurality of transistors Tr, a plurality of electrodes $E_{TR}$, a plurality of contacts $C_{TR}$, and the like, which constitute a control circuit that controls the memory cell array MCA. The transistor Tr is a field effect transistor that uses a surface of the semiconductor substrate region 100S as a channel region (gate region). The electrode $E_{TR}$ functions as a gate electrode of the transistor Tr. The contact $C_{TR}$ extends in the Z direction, a lower end thereof is connected to the semiconductor substrate 100 or the electrode $E_{TR}$, and an upper end thereof is connected to a wiring of the wiring layer $L_{W1}$.

Structure of Wiring Layer $L_{W1}$

For example, as shown in FIGS. 2 to 4, a plurality of wirings provided in the wiring layer $L_{W1}$ are electrically connected to at least one of an element in the memory cell array MCA and an element in the control circuit that controls the memory cell array MCA.

The wiring layer $L_{W1}$ includes the plurality of wirings. The plurality of wirings may include, for example, a stacked film of a barrier conductive film made of titanium nitride (TiN) or the like and a metal film made of tungsten (W) or the like.

Structure of Memory Cell Array Layer $L_{MCA}$

As shown in FIG. 3, for example, the memory cell array layer $L_{MCA}$ includes a plurality of memory block sets BLKs arranged in the Y direction and inter-block structures 160 provided among the plurality of memory block sets BLKs. Each of the memory block set BLKs includes two memory blocks BLK arranged in the Y direction, two inter-block structures 161 arranged in the X direction between the two memory blocks BLK, and a penetrating contact structure 170 provided between the inter-block structures 161. In the following description, the four memory blocks BLK shown in FIG. 3 may be referred to as memory blocks BLK_A to BLK_D, respectively.

Structure of Memory Block BLK of Memory Cell Array Layer $L_{MCA}$

As shown in FIG. 3, each memory block BLK includes two memory hole regions $R_{MH1}$, $R_{MH2}$ extending in the X direction and arranged in the X direction, a contact region $R_C$, and a wiring region $R_W$. The contact region $R_C$ and the wiring region $R_W$ are arranged in the X direction, and are formed between the memory hole region $R_{MH1}$ and the memory hole region $R_{MH2}$.

In the memory blocks BLK_B, BLK_C, the contact region $R_C$ is formed on a side (left side in FIG. 3) close to the memory hole region $R_{MH1}$, and the wiring region $R_W$ is formed on a side (right side in FIG. 3) close to the memory hole region $R_{MH2}$.

In the memory blocks BLK_A, BLK_D, the wiring region $R_W$ is formed on the side (left side in FIG. 3) close to the memory hole region $R_{MH1}$, and the contact region $R_C$ is formed on the side (right side in FIG. 3) close to the memory hole region $R_{MH2}$.

Structure of Memory Hole Regions $R_{MH1}$, $R_{MH2}$ of Memory Block BLK

As shown in FIGS. 3 and 6, each of the memory hole regions $R_{MH1}$, $R_{MH2}$ of the memory block BLK includes a plurality of string units SU arranged in the Y direction, and an inter-string unit insulating layer 162 that is made of silicon oxide ($SiO_2$) or the like and is provided between two string units SU adjacent to each other in the Y direction.

For example, as shown in FIGS. 2 and 6, the memory hole regions $R_{MH1}$, $R_{MH2}$ of the memory block BLK include a plurality of conductive layers 110 arranged in the Z direction, a plurality of semiconductor pillars 120 extending in the Z direction, and a plurality of gate insulating films 130 provided between the plurality of conductive layers 110 and the plurality of semiconductor pillars 120.

The conductive layer 110 is a plate-shaped conductive layer extending in the X direction. The conductive layer 110 may include a stacked film of a barrier conductive film made of titanium nitride (TiN) or the like and a metal film made of tungsten (W) or the like. The conductive layer 110 may include, for example, polycrystalline silicon containing impurities such as phosphorus (P) or boron (B). Insulating layers 101 made of silicon oxide ($SiO_2$) or the like are provided among the plurality of conductive layers 110 arranged in the Z direction.

A conductive layer 111 is provided below the conductive layer 110. The conductive layer 111 may contain, for example, polycrystalline silicon containing impurities such as phosphorus (P) or boron (B). The insulating layer 101 made of silicon oxide ($SiO_2$) or the like is provided between the conductive layer 111 and the conductive layer 110.

A conductive layer 112 is provided below the conductive layer 111. The conductive layer 112 includes a semiconductor layer 113 bonded to a lower end of the semiconductor pillar 120, and a conductive layer 114 in contact with a lower surface of the semiconductor layer 113. The semiconductor layer 113 may contain, for example, polycrystalline silicon containing N-type impurities such as phosphorus (P) or P-type impurities such as boron (B). The conductive layer 114 may include, for example, a conductive layer made of a metal such as tungsten (W), tungsten silicide or the like, or the other conductive layer. The insulating layer 101 made of silicon oxide ($SiO_2$) or the like is provided between the conductive layer 112 and the conductive layer 111.

The conductive layer 112 functions as a source line.

The conductive layer 111 functions as a gate electrode or the like of a source-side select transistor. The conductive layer 111 is electrically independent for each memory block BLK.

Among the plurality of conductive layers 110, one or a plurality of conductive layers 110 positioned at a lowermost layer are electrically independent for each memory block BLK, and function as the gate electrode or the like of the source-side select transistor. At that time, the conductive layer 111 may be omitted. A plurality of conductive layers 110 positioned above these layers are electrically independent for each memory block BLK, and function as a word line or the like. One or a plurality of conductive layers 110 positioned above these layers are electrically independent for each string unit SU, and function as a gate electrode or the like of a drain-side select transistor.

The semiconductor pillars 120 are arranged in a predetermined pattern in the X direction and the Y direction. The semiconductor pillar 120 functions as a memory cell or the like. The semiconductor pillar 120 is, for example, a semiconductor layer such as polycrystalline silicon (Si). The semiconductor pillar 120 has, for example as shown in FIGS. 2 and 6, a bottomed cylindrical shape, and is provided with an insulating layer 125 made of silicon oxide or the like in a center portion of the semiconductor pillar 120.

The gate insulating film 130 has a bottomed cylindrical shape that covers an outer peripheral surface of the semiconductor pillar 120. For example, as shown in FIG. 7, the gate insulating film 130 includes a tunnel insulating film 131, a charge storage film 132, and a block insulating film 133 which are stacked between the semiconductor pillar 120 and the conductive layer 110. The tunnel insulating film 131 and the block insulating film 133 are, for example, insulating films made of silicon oxide ($SiO_2$) or the like. The charge storage film 132 is, for example, a film that is capable of storing charges and is made of silicon nitride ($Si_3N_4$) or the like. The tunnel insulating film 131, the charge storage film 132, and the block insulating film 133 have a cylindrical shape and extend in the Z direction along the outer peripheral surface of the semiconductor pillar 120.

FIG. 7 shows an example in which the gate insulating film 130 includes the charge storage film 132 made of silicon nitride or the like. Alternatively, the gate insulating film 130 may include, for example, a floating gate made of polycrystalline silicon or the like containing the N-type or P-type impurities.

Structure of Contact Region $R_C$ of Memory Block BLK

For example, as shown in FIGS. 3 to 5, in the contact region $R_C$ of the memory cell array layer $L_{MCA}$, similarly to the memory hole regions $R_{MH1}$, $R_{MH2}$, a plurality of conductive layers 110 are arranged in the Z direction. The number of conductive layers 110 is, for example, several tens to several hundreds in practice, but in order to facilitate understanding, FIGS. 4 and 5 illustrate a state in which eight conductive layers 110 are provided in the memory cell array layer $L_{MCA}$.

In the contact region $R_C$, a wiring region $R_{CW}$ extending in the X direction and a connection region $R_{CC}$ extending in the X direction are formed side by side in the Y direction. The wiring region $R_{CW}$ is formed at a position close to the inter-block structure 160, and the connection region $R_{CC}$ is formed at a position close to the inter-block structure 161.

The wiring region $R_{CW}$ includes a part of the plurality of conductive layers 110 arranged in the Z direction. The part of the conductive layers 110 extends in the X direction along the inter-block structure 160.

The connection region $R_{CC}$ includes a plurality of contacts 150 arranged in the X direction and a part of the plurality of conductive layers 110 arranged in the Z direction.

Each contact 150 extends in the Z direction, and may include, for example, a stacked film of a barrier conductive film made of titanium nitride (TiN) or the like and a metal film made of tungsten (W) or the like. A lower end of each contact 150 is connected to one of the part of the plurality of conductive layers 110 arranged in the Z direction.

Each layer of the part of the plurality of conductive layers 110 arranged in the Z direction includes a connection portion connected to one of the plurality of contacts 150 and an opening 110a for connecting contacts 150 other than the one contact 150 to the lower conductive layer 110. A width of the opening 110a in the X direction is gradually narrowed from the conductive layers 110 on an upper layer side toward the conductive layers 110 on a lower layer side, and accordingly, a stepped structure (recessed portion) is formed in the connection region $R_{CC}$ (FIGS. 4 and 5). The stepped structure (recessed portion) is filled with insulating layers 140 made of silicon oxide ($SiO_2$) or the like.

Structure of Wiring Region $R_W$ of Memory Block BLK

The wiring region $R_W$ includes a part of the plurality of conductive layers 110 arranged in the Z direction. The part of the conductive layers 110 extends in the X direction along the inter-block structure 160.

The plurality of conductive layers 110 in the wiring region $R_W$ and the plurality of conductive layers 110 in the wiring region $R_{CW}$ described above are connected to each other for each layer. That is, the plurality of conductive layers 110 in the memory hole region $R_{MH1}$ and the plurality of conductive layers 110 in the memory hole region $R_{MH2}$ are connected to each other via the plurality of conductive layers 110 in the wiring region $R_W$ and the wiring region $R_{CW}$ for each layer.

Structure of Inter-block Structure 161 of Memory Cell Array Layer $L_{MCA}$

For example, as shown in FIGS. 2 to 4, the inter-block structure 161 includes a pair of insulating layers 161a, 161a extending in the Z direction and the X direction, and a conductive layer 161b formed between the insulating layers 161a, 161a. For example, as shown in FIGS. 2 and 4, a lower end of the conductive layer 161b is connected to the conductive layer 112.

For example, as shown in FIG. 3, the inter-block structure 161 is provided at a position which is between two adjacent memory blocks BLK in the Y direction and corresponds to the memory hole region $R_{MH1}$, the contact region $R_C$, and the memory hole region $R_{MH2}$.

Structure of Penetrating Contact Structure 170 of Memory Cell Array Layer $L_{MCA}$ As shown in FIG. 3, a penetrating contact structure 170 is disposed between two memory blocks BLK constituting one memory block set BLKs. For example, a penetrating contact structure 170 is between the memory blocks BLK_B and BLK_C, in the Y direction. More specifically, the penetrating contact structure 170 in this example is disposed between the wiring region $R_W$ of the memory block BLK_B and the wiring region $R_W$ of the memory block BLK_C. In the X direction, the penetrating contact structure 170 is disposed between two inter-block structures 161 arranged in the X direction. This region of a memory block BLK may be referred to as a penetrating contact region.

The penetrating contact structure 170 includes a pair of stopper insulating layers 171, 172 extending in the X direction and separated from each other in the Y direction, and a pair of stopper insulating layers 173, 174 extending in the Y direction and separated from each other in the X direction. The stopper insulating layers 171, 172, 173, 174 contain, for example, silicon oxide ($SiO_2$) or the like. As shown in FIGS. 4 and 5, the stopper insulating layers 171, 172, 173, 174 extend in the Z direction from an upper layer portion toward a lower layer portion of the memory cell array layer $L_{MCA}$. Further, end sides of the stopper insulating layers 171, 172 in the X direction are connected to end sides of the stopper insulating layers 173, 174 in the Y direction. Accordingly, the stopper insulating layers 171, 172, 173, 174 form a rectangular cylindrical structure formed of the insulating layers.

In the Z direction, lower end positions of the stopper insulating layers 171, 172 are different from lower end positions of the stopper insulating layers 173, 174. For example, as shown in FIGS. 8 and 9, in the Z direction, lower ends of the stopper insulating layers 171, 172 may be positioned lower than lower ends of the stopper insulating layers 173, 174. For example, as shown in FIG. 10, in the Z direction, the lower ends of the stopper insulating layers 171, 172 may be positioned higher than the lower ends of the stopper insulating layers 173, 174.

A thickness (width in the Y direction) of the stopper insulating layers 171, 172 is different from a thickness (width in the X direction) of the stopper insulating layers 173, 174. For example, as shown in FIG. 3, the thickness (width in the X direction) of the stopper insulating layers 173, 174 may be larger than the thickness (width in the Y direction) of the stopper insulating layers 171, 172. In another example, the thickness (width in the X direction) of the stopper insulating layers 173, 174 may be smaller than the thickness (width in the Y direction) of the stopper insulating layers 171, 172.

One end portion of the two inter-block structures 161 arranged in the X direction is connected to a center position of the stopper insulating layer 173 in the Y direction, and the other end portion of the two inter-block structures 161 arranged in the X direction is connected to a center position of the stopper insulating layer 174 in the Y direction. That is, the conductive layers 110 of the layers stacked in the Z direction provided in the two memory blocks BLK, for example, the memory blocks BLK_B, BLK_C, constituting one memory block set BLKs are divided in the Y direction for each memory block by the inter-block structure 161 and the stopper insulating layers 171, 172, 173, 174.

As shown in FIGS. 3 to 5, a plurality of penetrating contacts 151 of a first group arranged in the X direction, a plurality of penetrating contacts 151 of a second group arranged in the X direction at positions shifted with respect to the plurality of through contacts 151 of the first group in the Y direction, a plurality of insulating layers 110A arranged in the Z direction, and a part of the plurality of insulating layers 101 are provided inside the rectangular cylindrical structure formed of the insulating layers and formed by the stopper insulating layers 171, 172, 173, 174. That is, the insulating layers 101 and the insulating layers 110A are alternately stacked in the Z direction inside the rectangular cylindrical structure formed by the stopper insulating layers 171, 172, 173, 174. Each of the penetrating contacts 151 extends in the Z direction and penetrates the plurality of insulating layers 110A and the plurality of insulating layers 101.

The penetrating contact 151 may include, for example, a stacked film made of titanium nitride (TiN) and tungsten (W), or may include the other materials. Outer peripheral surfaces of the penetrating contacts 151 are connected to inner peripheral surfaces of through via holes formed in the plurality of insulating layers 110A and the plurality of insulating layers 101. The insulating layer 110A may be, for example, an insulating layer containing silicon (Si) and nitrogen (N) such as silicon nitride (SiN).

As shown in FIG. 5, an outer peripheral surface of an upper end portion of the penetrating contact structure 170 is covered with the insulating layer 140.

Structure of Inter-block Structure 160 of Memory Cell Array Layer $L_{MCA}$

For example, as shown in FIGS. 2 to 4, the inter-block structure 160 includes a pair of insulating layers 160a, 160a extending in the Z direction and the X direction, and a conductive layer 160b disposed between the insulating layers 160a, 160a. For example, as shown in FIGS. 2 and 4, a lower end of the conductive layer 160b is connected to the conductive layer 112.

For example, as shown in FIG. 3, the inter-block structure 160 includes a portion $160_{MH}$ provided at a position corresponding to the memory hole regions $R_{MH1}$, $R_{MH2}$ between two adjacent memory blocks BLK in the Y direction, and portions $160_{C-W}$ provided at positions corresponding to the contact region $R_C$ and the wiring region $R_W$. The inter-block structure 160 includes portions $160_A$ provided between the above-mentioned portion $160_{MH}$ and the above-mentioned portions $160_{C-W}$ and between the above-mentioned portions $160_{C-W}$ and the above-mentioned portions $160_{C-W}$.

For example, the above-mentioned portion $160_{MH}$ is provided between the memory hole region $R_{MH1}$ of the memory block BLK_A and the memory hole region $R_{MH1}$ of the memory block BLK_B. This portion $160_{MH}$ extends in the X direction.

For example, the above-mentioned portion $160_{C-W}$ is provided between the wiring region $R_W$ of the memory block BLK_A and the contact region $R_C$ of the memory block BLK_B. This portion $160_{C-W}$ extends in the X direction. A position of this portion $160_{C-W}$ in the Y direction is on one side (for example, a lower side in FIG. 3) in the Y direction with respect to a position of the above-mentioned portion $160_{MH}$ in the Y direction. That is, for example, a distance between the position of the portion $160_{C-W}$ in the Y direction and the position of the inter-block structure 161 corresponding to the memory block BLK_A in the Y direction is smaller than a distance between the position of the above-mentioned portion $160_{MH}$ in the Y direction and the position of the inter-block structure 161 corresponding to the memory block BLK_A in the Y direction. A width of this portion $160_{C-W}$ in the X direction is larger than a width of the maximum opening 110a in the X direction. The maximum opening 110a is formed in the contact region $R_C$ of the memory block BLK_B.

For example, the above-mentioned portion $160_{C-W}$ is provided between the contact region $R_C$ of the memory block BLK_A and the wiring region $R_W$ of the memory block BLK_B. This portion $160_{C-W}$ extends in the X direction. A position of this portion $160_{C-W}$ in the Y direction is on the other side (for example, an upper side in FIG. 3) in the Y direction with respect to a position of the above-mentioned portion $160_{MH}$ in the Y direction. That is, for example, a distance between the position of the portion $160_{C-W}$ in the Y direction and the position of the inter-block structure 161 corresponding to the memory block BLK_A in the Y direction is larger than a distance between the position of the above-mentioned portion $160_{MH}$ in the Y direction and the position of the inter-block structure 161 corresponding to the memory block BLK_A in the Y direction. A width of this portion $160_{C-W}$ in the X direction is larger than a width of the maximum opening 110a in the X direction. The maximum opening 110a is formed in the contact region $R_C$ of the memory block BLK_A.

For example, the above-mentioned portion $160_{MH}$ is provided between the memory hole region $R_{MH2}$ of the memory block BLK_A and the memory hole region $R_{MH2}$ of the memory block BLK_B. This portion $160_{MH}$ extends in the X direction. A position of this portion $160_{MH}$ in the Y direction is equal to the position of the above-mentioned portion $160_{MH}$ in the Y direction. The above-mentioned portion $160_{MH}$ is provided between the memory hole region $R_{MH1}$ of the memory block BLK_A and the memory hole region $R_{MH1}$ of the memory block BLK_B.

For example, the portion $160_A$ is provided between the above-mentioned portion $160_{MH}$ and the portion $160_{C-W}$, or between the portion $160_{C-W}$ and the portion $160_{C-W}$, and extends in a direction between the X direction and the Y direction (an inclined direction in FIG. 3) in a manner of being connected to these portions.

Structure of Wiring Layer $L_{W2}$

For example, as shown in FIGS. 4 and 5, a plurality of wirings provided in the wiring layer $L_{W2}$ are electrically connected to at least one of an element in the memory cell array MCA and an element in the control circuit that controls the memory cell array MCA. For example, the wirings of the wiring layer $L_{W2}$ are connected to the conductive layers 110 of the memory cell array layer $L_{MCA}$ via the contact 150, or connected to the transistor Tr or the like of the transistor layer $L_{TR}$ via the penetrating contacts 151 and the wirings of the wiring layer $L_{W1}$. For example, the plurality of conductive layers 110 are connected to the plurality of transistors Tr of the transistor layer $L_{TR}$ via the plurality of contacts 150, the wirings of the wiring layer $L_{W2}$, the plurality of penetrating contacts 151, the wirings of the wiring layer $L_{W1}$, and the like.

The plurality of wirings provided in the wiring layer $L_{W2}$ may include, for example, a stacked film of a barrier conductive film made of titanium nitride (TiN) or the like and a metal film made of copper (Cu) or the like. A part of the plurality of wirings provided in the wiring layer $L_{W2}$ and extending in the Y direction function as bit lines BL (FIG. 2).

Manufacturing Method

Next, a part of a method of manufacturing the semiconductor storage device according to the first embodiment will be described with reference to FIGS. 11 to 21, which illustrate schematic cross-sectional views of structures. FIGS. 11, 13, 16, 17, 18, and 20 illustrate Y-Z cross-sectional views corresponding to FIG. 4, and FIGS. 12, 14, 15, 19, and 21 are X-Z cross-sectional views corresponding to FIG. 5.

Preparation Step

In the manufacturing method, first, the transistor layer $L_{TR}$ and the wiring layer $L_{W1}$ are formed on the semiconductor substrate 100.

Figure 11:
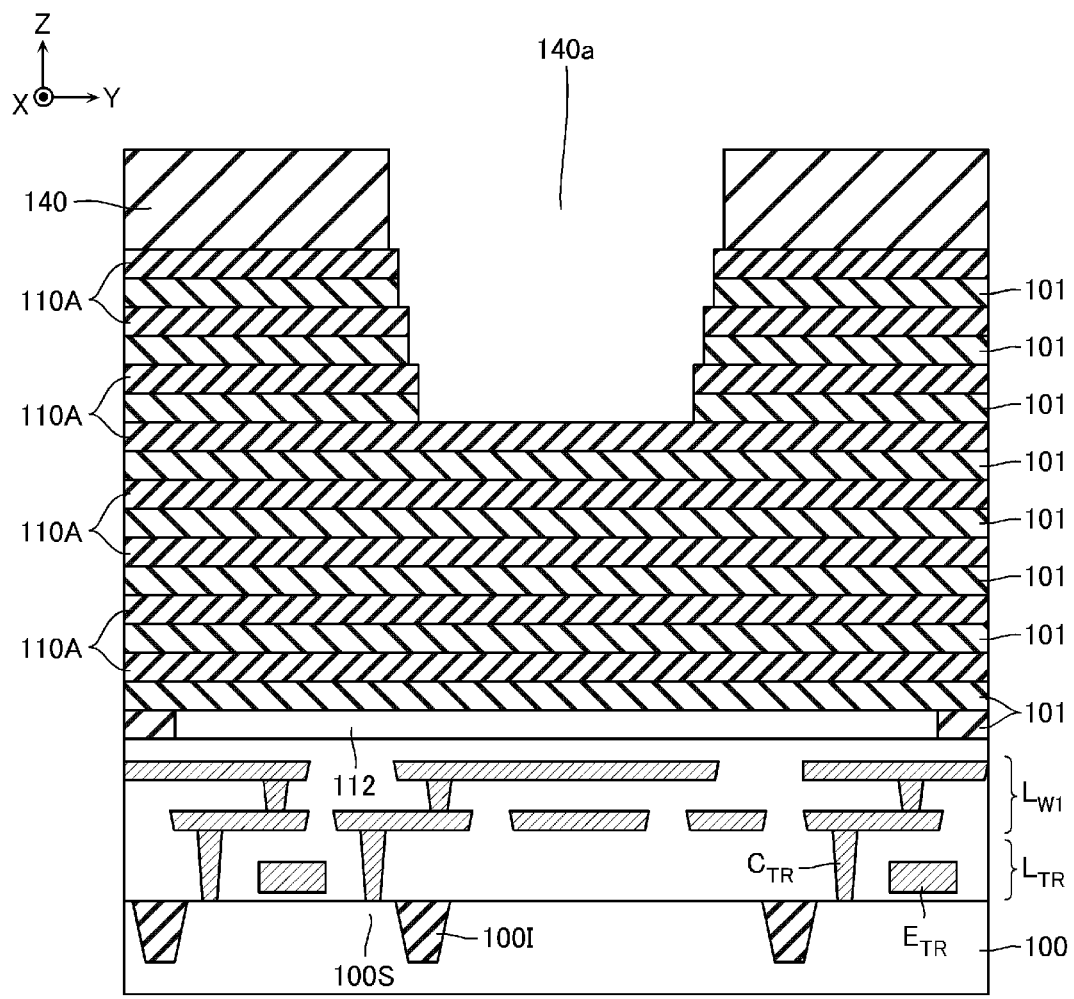
FIG. 11 illustrates a schematic Y-Z cross-sectional view of a structure to illustrate a method for manufacturing the semiconductor storage device according to the first embodiment.
Figure 12:
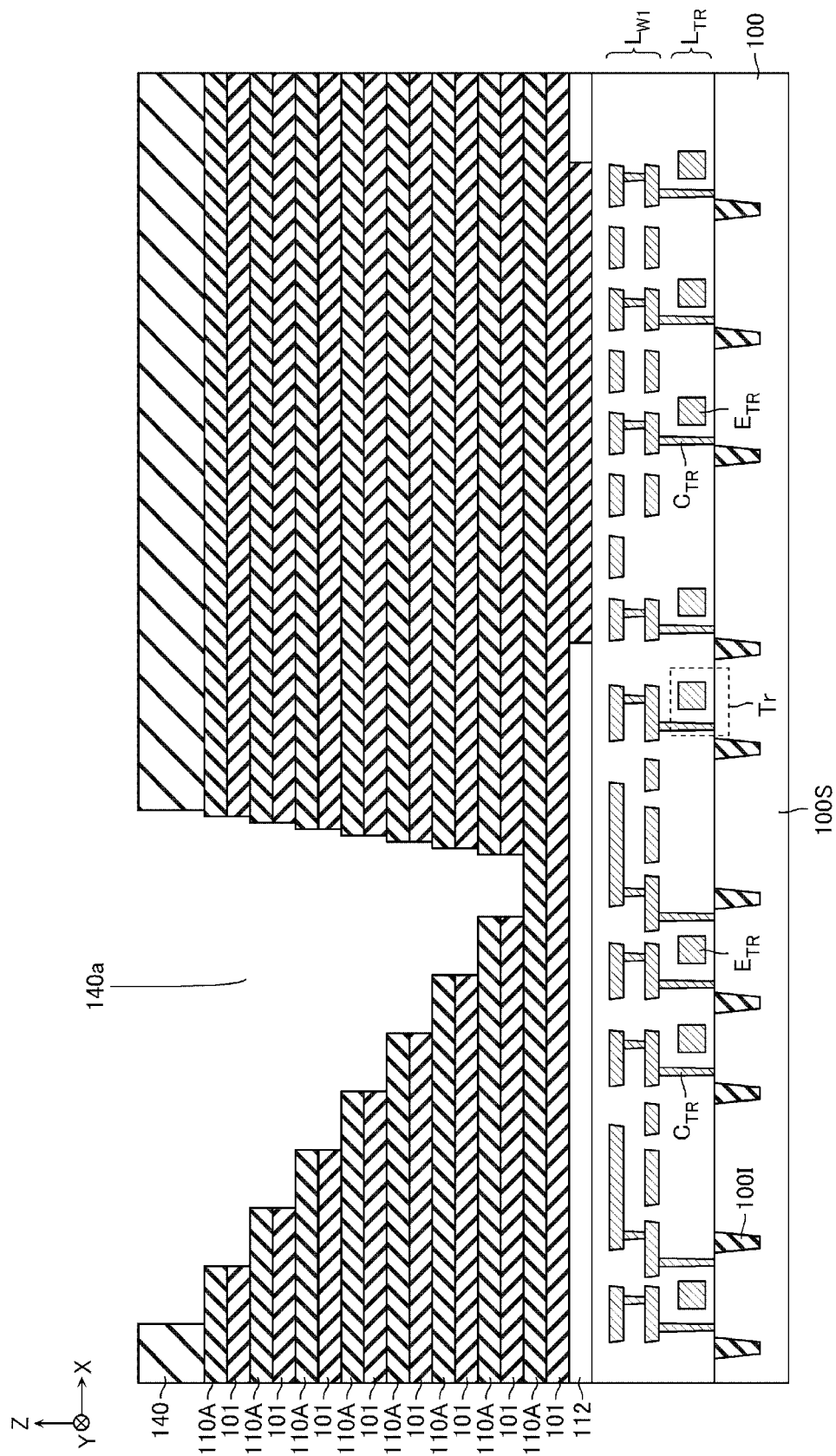
FIG. 12 illustrates a schematic X-Z cross-sectional view of a structure to illustrate the method for manufacturing the semiconductor storage device according to the first embodiment.

First Step: FIGS. 11 and 12

A first step will be described with reference to FIGS. 11 and 12. In the first step, after the conductive layer 112 is deposited on the wiring layer $L_{W1}$ and patterning is performed by lithography at a position where the penetrating contact structure 170 is to be formed, the conductive layer 112 is removed by dry etching such as reactive ion etching (RIE). Thereafter, the insulating layer 101 is deposited in a region where the conductive layer 112 is removed, and planarization is performed by, for example, chemical mechanical polishing (CMP). Thereafter, the plurality of insulating layers 101 and the plurality of insulating layers 110A are alternately formed to form a structure in which the insulating layers 101 and the insulating layers 110A are alternately stacked in the Z direction. This process is performed by, for example, chemical vapor deposition (CVD) or the like.

Next, the insulating layer 140 made of silicon oxide ($SiO_2$) or the like is formed on the plurality of insulating layers 101 and the plurality of insulating layers 110A that are stacked. This process is performed by, for example, CVD or the like.

Next, a portion of the insulating layer 140 corresponding to the connection region $R_{CC}$ (FIGS. 3 to 5) of the contact region $R_C$ is removed to form an opening 140a on the insulating layer 140.

Next, in the portion corresponding to the connection region $R_{CC}$ of the contact region $R_C$, a part of the insulating layers 101 and the insulating layers 110A is removed via the opening 140a of the insulating layer 140 to form a stepped structure (recessed portion). This process is performed by forming a resist on upper surfaces of the insulating layers 101 and the insulating layers 110A that are alternately formed, and repeating removal of a part of the insulating layers 101, removal of a part of the insulating layers 110A, and removal of a part of the resist. The process of removing the insulating layer 101, the insulating layer 110A, and the resist is performed by, for example, wet etching or dry etching such as reactive ion etching (RIE).

Figure 13:
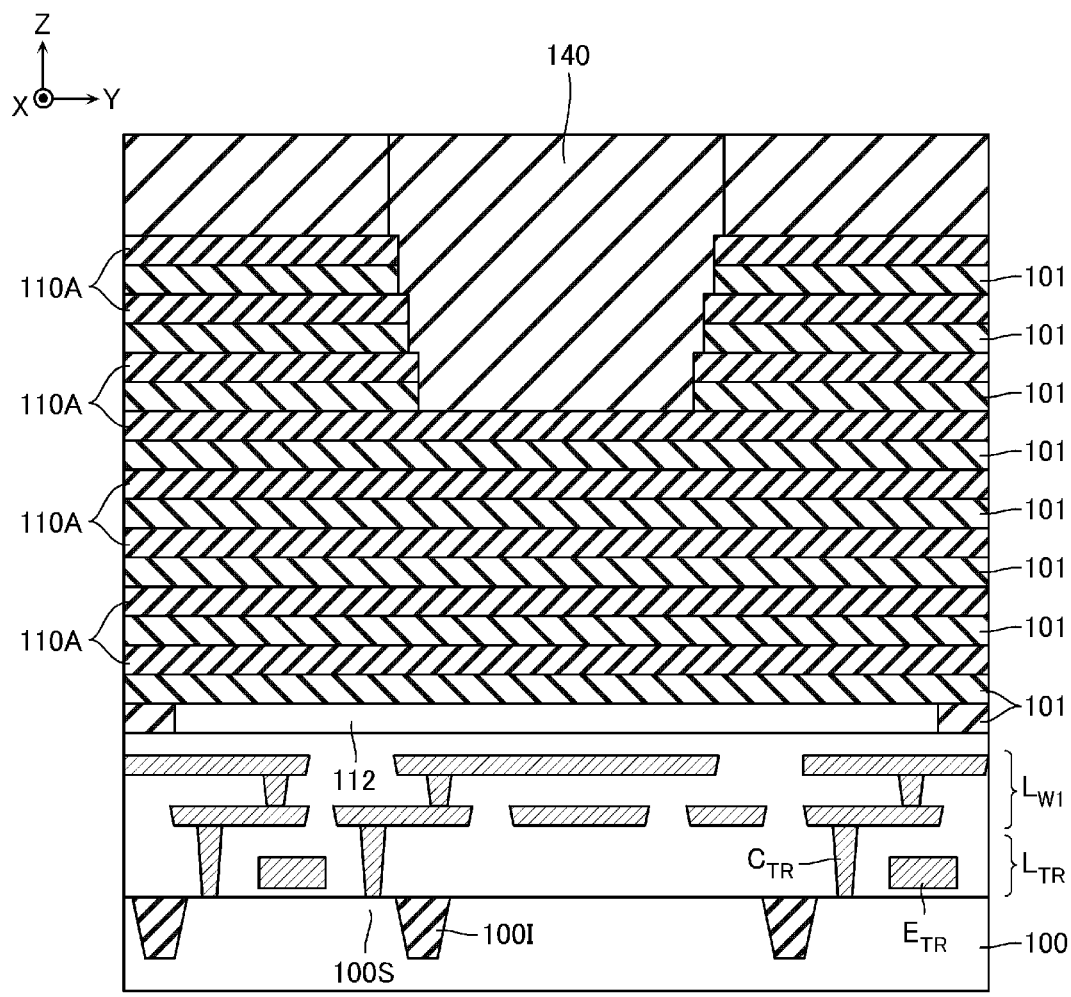
FIG. 13 illustrates a schematic Y-Z cross-sectional view of a structure to illustrate the method for manufacturing the semiconductor storage device according to the first embodiment.
Figure 14:
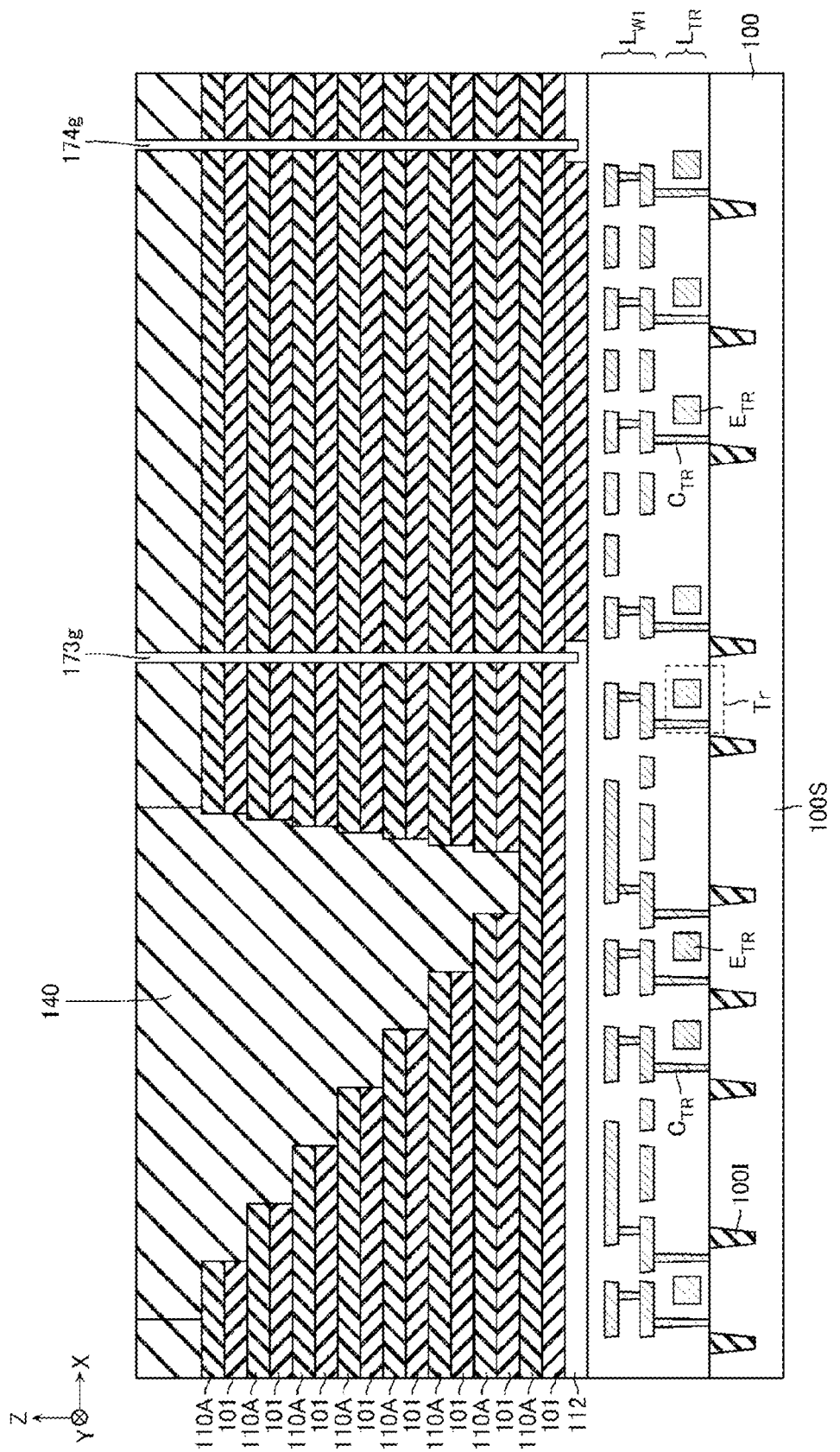
FIG. 14 illustrates a schematic X-Z cross-sectional view of a structure to illustrate the method for manufacturing the semiconductor storage device according to the first embodiment.

Second Step: FIGS. 13 and 14

A second step will be described with reference to FIGS. 13 and 14. In the second step, the stepped structure (recessed portion) and the opening 140a are filled with the insulating layer 140. This process is performed by, for example, CVD or the like.

Next, stopper insulating layer grooves 173g, 174g are formed at positions where the stopper insulating layers 173, 174 are to be formed. The stopper insulating layer grooves 173g, 174g extend in the Z direction and penetrate the insulating layers 101 and the insulating layers 110A. The stopper insulating layer grooves 173g, 174g are formed by, for example, RIE or the like.

In the insulating layers 101 and the insulating layers 110A that are stacked in the Z direction, a portion sandwiched between the stopper insulating layer grooves 173g, 174g extends in the Y direction beyond positions where the stopper insulating layer grooves 173g, 174g are formed in the Y direction. For that reason, even when the stopper insulating layer grooves 173g, 174g are formed, the portion, in the insulating layers 101 and the insulating layers 110A, sandwiched between the stopper insulating layer grooves 173g, 174g is supported by a portion of the insulating layers 101 and the insulating layers 110A extending in the Y direction beyond the positions where the stopper insulating layer grooves 173g, 174g are formed, and is not inclined or collapsed.

Figure 15:
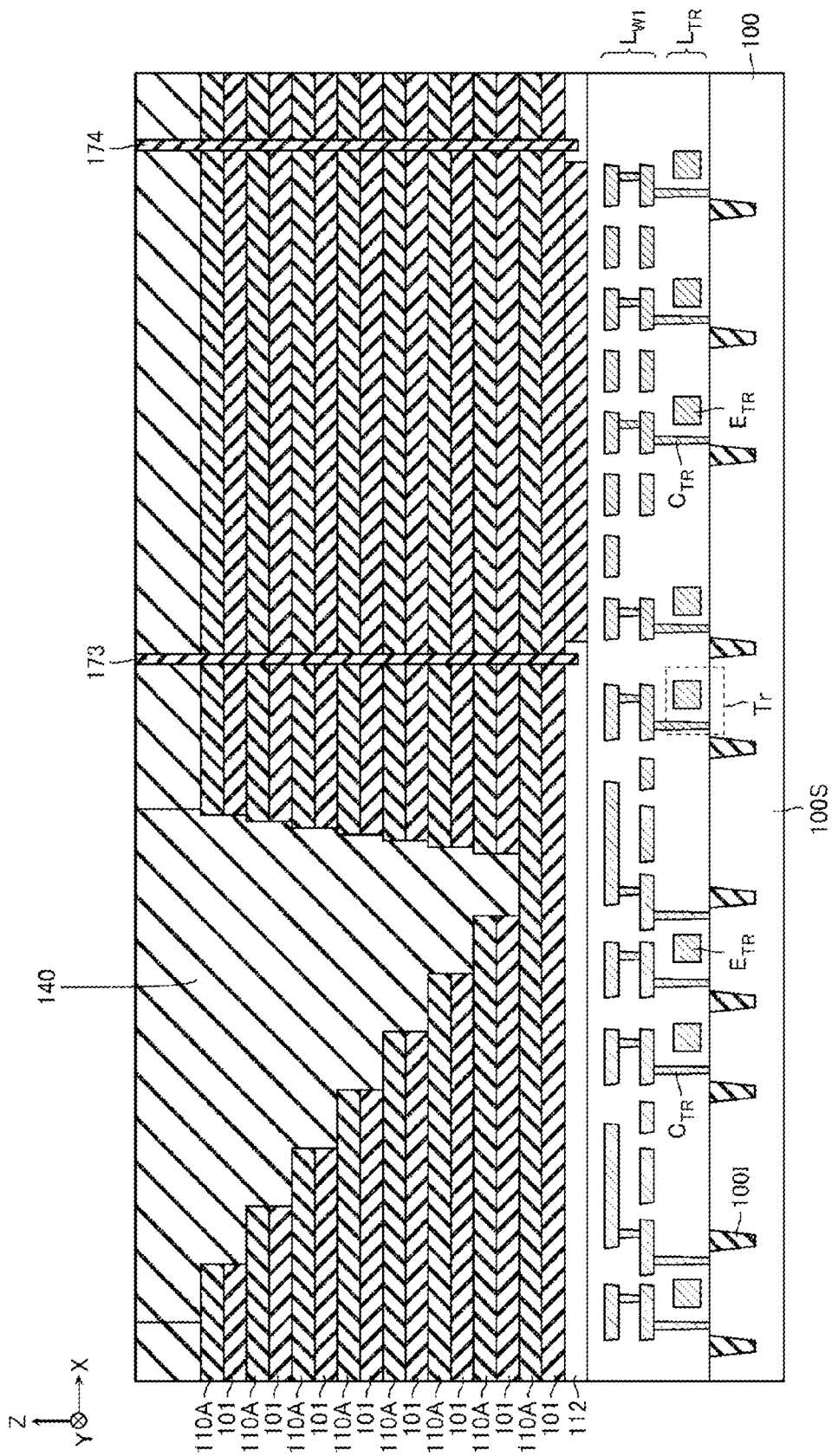
FIG. 15 illustrates a schematic X-Z cross-sectional view of a structure to illustrate the method for manufacturing the semiconductor storage device according to the first embodiment.

Third Step: FIG. 15

A third step will be described with reference to FIG. 15. In the third step, the stopper insulating layer grooves 173g, 174g are filled with silicon oxide ($SiO_2$) or the like to form the stopper insulating layers 173, 174. This process is performed by, for example, CVD or the like.

Figure 16:
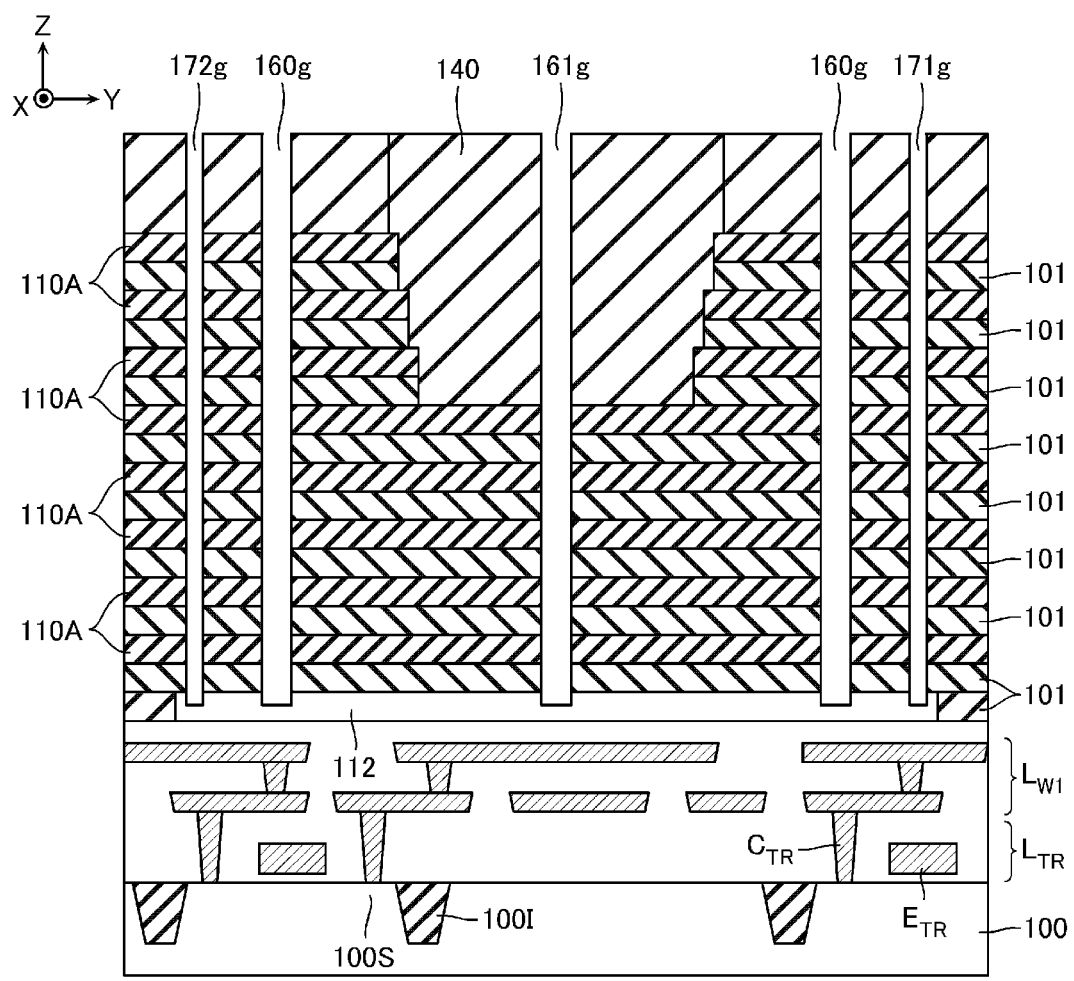
FIG. 16 illustrates a schematic Y-Z cross-sectional view of a structure to illustrate the method for manufacturing the semiconductor storage device according to the first embodiment.

Fourth Step: FIG. 16

A fourth step will be described with reference to FIG. 16. In the fourth step, inter-block structure grooves 160g, 161g are formed at positions where the inter-block structures 160, 161 are to be formed, and stopper insulating layer grooves 171g, 172g are formed at positions where the stopper insulating layers 171, 172 are to be formed. The inter-block structure grooves 160g, 161g and the stopper insulating layer grooves 171g, 172g extend in the Z direction and penetrate the insulating layers 101 and the insulating layers 110A. The inter-block structure grooves 160g, 161g and the stopper insulating layer grooves 171g, 172g are formed by, for example, RIE or the like.

In the X direction, in the insulating layers 101 and the insulating layers 110A that are stacked in the Z direction, a portion sandwiched between the stopper insulating layer grooves 171g, 172g is connected to the insulating layers 101 and the insulating layers 110A extending in the X direction beyond the positions where the stopper insulating layer grooves 171g, 172g are formed in the X direction via the stopper insulating layers 173, 174. For that reason, even when the stopper insulating layer grooves 171g, 172g are formed, the portion, in the insulating layers 101 and the insulating layers 110A, sandwiched between the stopper insulating layer grooves 171g, 172g is supported by a portion of the insulating layers 101 and the insulating layers 110A extending in the X direction beyond the positions where the stopper insulating layer grooves 171g, 172g are formed, and is not inclined or collapsed.

Figure 17:
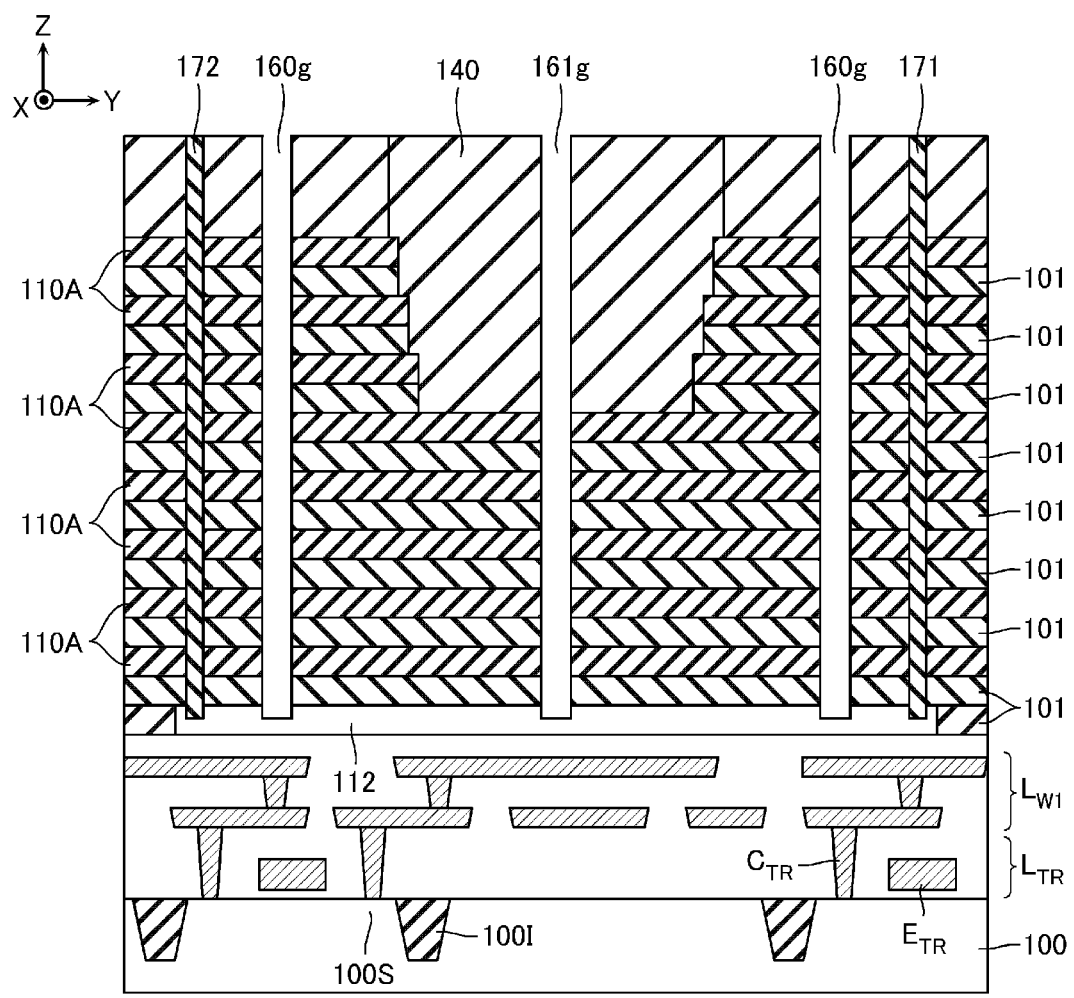
FIG. 17 illustrates a schematic Y-Z cross-sectional view of a structure to illustrate the method for manufacturing the semiconductor storage device according to the first embodiment.

Fifth Step: FIG. 17

A fifth step will be described with reference to FIG. 17. In the fifth step, the stopper insulating layer grooves 171g, 172g are filled with silicon oxide ($SiO_2$) or the like to form the stopper insulating layers 171, 172. This process is performed by, for example, CVD or the like.

By this process, as described above, the end sides of the stopper insulating layers 171, 172 in the X direction and the end sides of the stopper insulating layers 173, 174 in the Y direction are connected to each other, so that the stopper insulating layers 171, 172, 173, 174 form the rectangular cylindrical structure formed of the insulating layers.

Since the process of forming the stopper insulating layer grooves 173g, 174g is different from the process of forming the stopper insulating layer grooves 171g, 172g, in the Z direction, lower end positions of the stopper insulating layer grooves 173g, 174g are different from lower end positions of the stopper insulating layer grooves 171g, 172g. That is, as described above, in the Z direction, the lower end positions of the stopper insulating layers 171, 172 are different from the lower end positions of the stopper insulating layers 173, 174.

Figure 18:
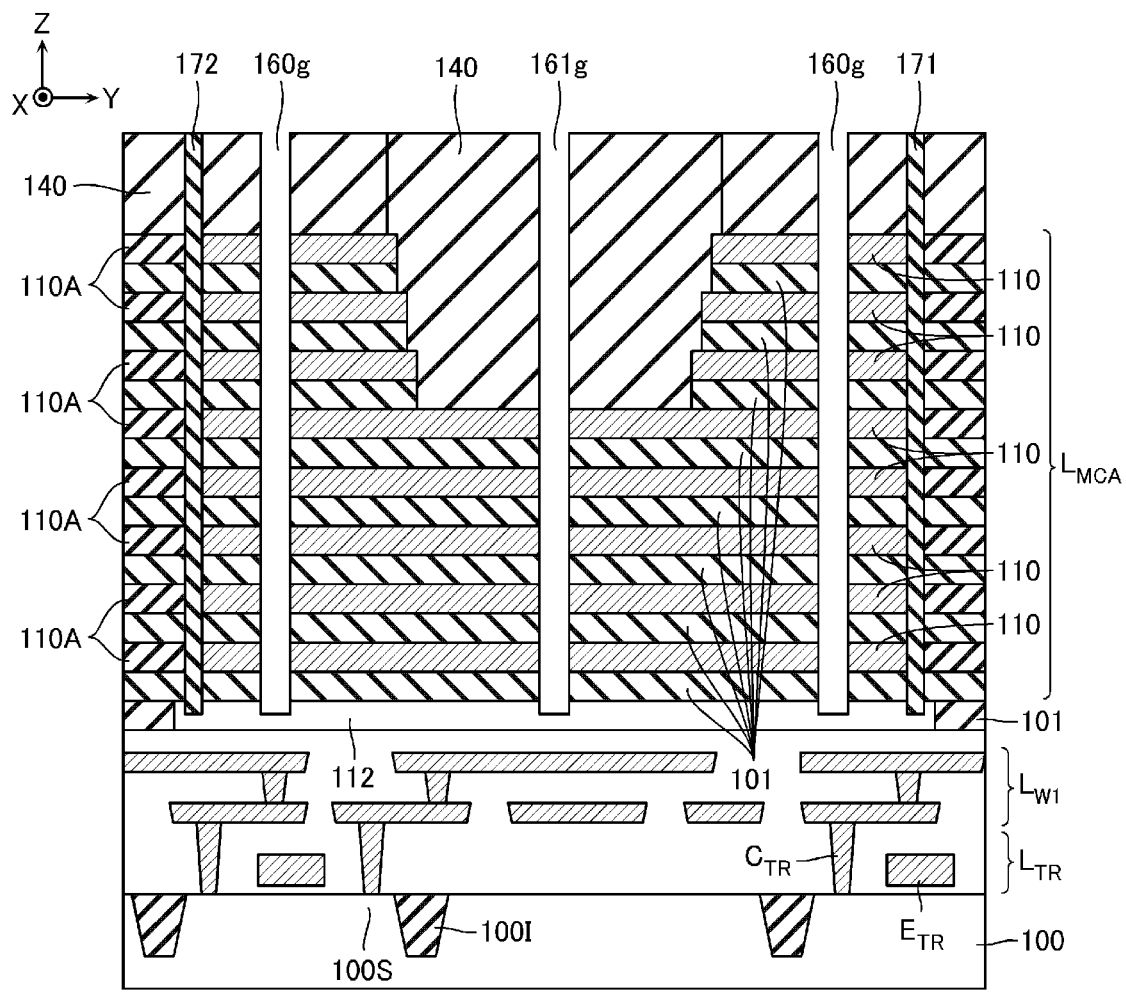
FIG. 18 illustrates a schematic Y-Z cross-sectional view of a structure to illustrate the method for manufacturing the semiconductor storage device according to the first embodiment.
Figure 19:
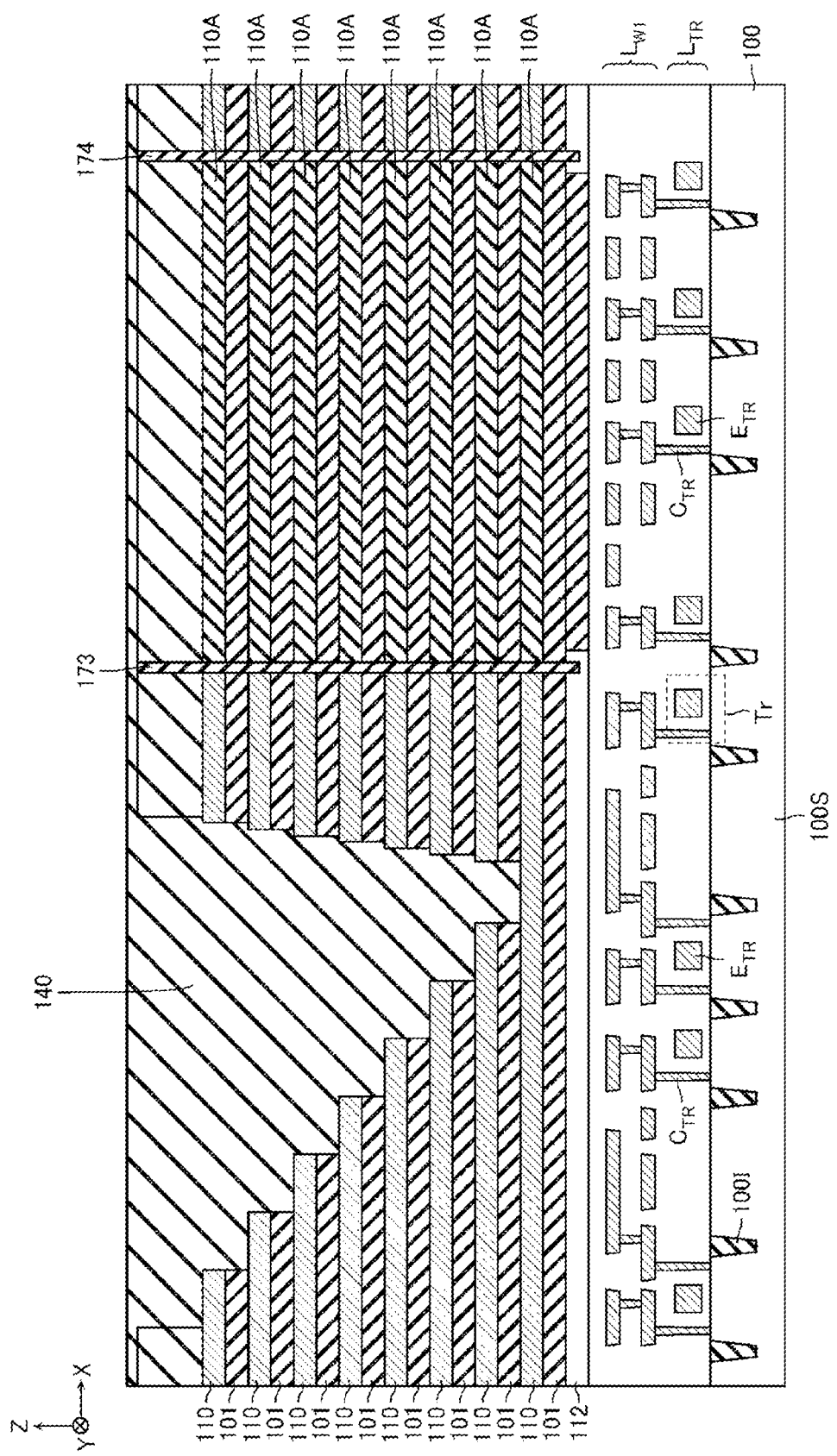
FIG. 19 illustrates a schematic X-Z cross-sectional view of a structure to illustrate the method for manufacturing the semiconductor storage device according to the first embodiment.

Sixth Step: FIGS. 18 and 19

A sixth step will be described with reference to FIGS. 18 and 19. In the sixth step, wet etching or the like using a chemical solution such as phosphoric acid is performed via the inter-block structure grooves 160g, 161g, and the insulating layers 110A is selectively removed.

Next, the conductive layers 110 are formed on portions from which the insulating layers 110A are removed. This process is performed, for example, by forming the conductive layers 110 by CVD or the like via the inter-block structure grooves 160g, 161g. The conductive layer 110 may include a stacked film of a barrier conductive film made of titanium nitride (TiN) or the like and a metal film made of tungsten (W) or the like.

Entrance of the chemical solution such as phosphoric acid is blocked by the stopper insulating layers 171, 172, 173, 174, so that the chemical solution such as phosphoric acid does not enter the inside of the rectangular cylindrical structure formed by the stopper insulating layers 171, 172, 173, 174. That is, the insulating layers 110A are not removed and remain inside the rectangular cylindrical structure formed by the stopper insulating layers 171, 172, 173, 174. As a result, a structure in which the insulating layers 101 and the insulating layers 110A are alternately stacked in the Z direction is held inside the rectangular cylindrical structure formed by the stopper insulating layers 171, 172, 173, 174 in the penetrating contact structure 170.

In the following description, such a process, that is, a process of selectively removing the insulating layers 110A by wet etching or the like and then forming the conductive layers 110 on the portions where the insulating layers 110A are removed may be referred to as "replace".

Figure 20:
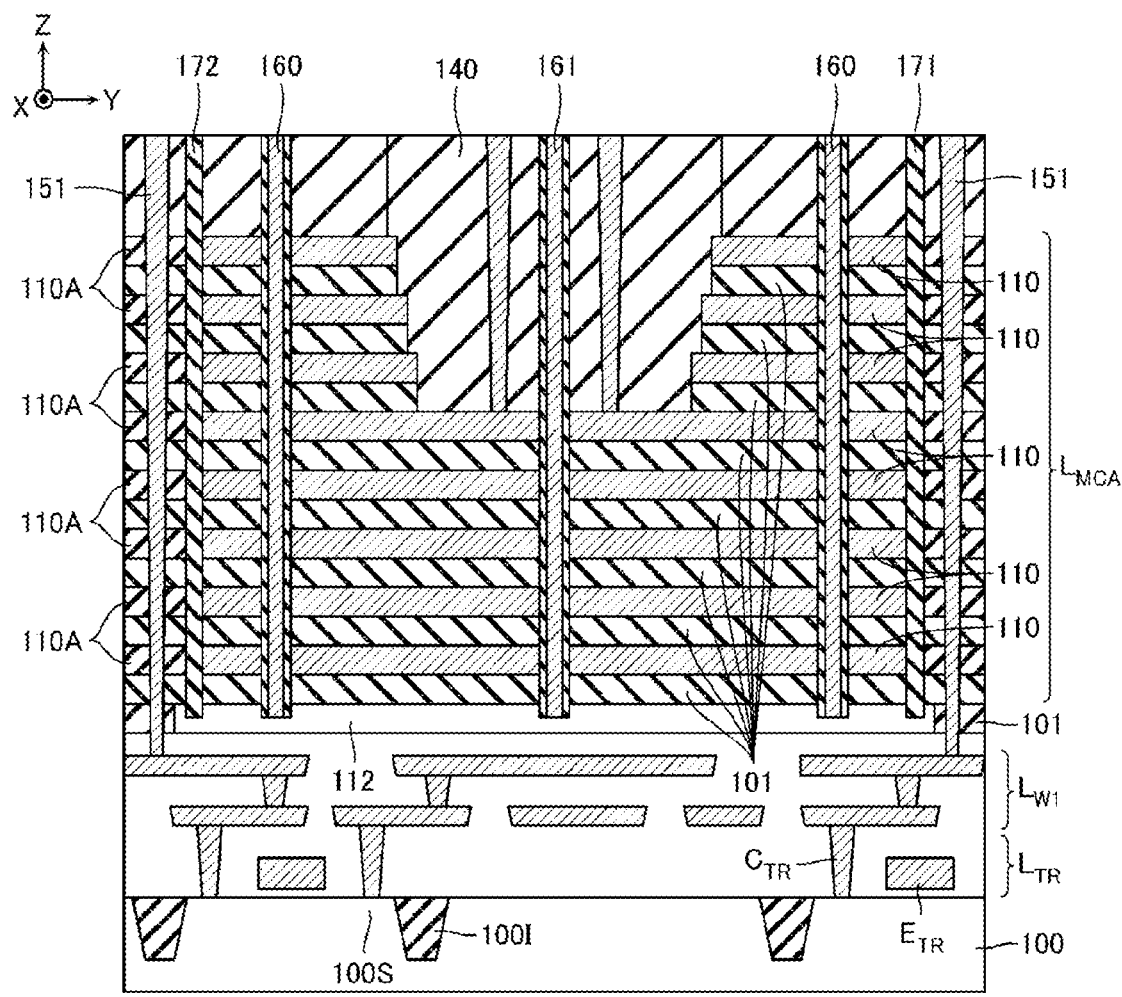
FIG. 20 illustrates a schematic Y-Z cross-sectional view of a structure to illustrate the method for manufacturing the semiconductor storage device according to the first embodiment.
Figure 21:
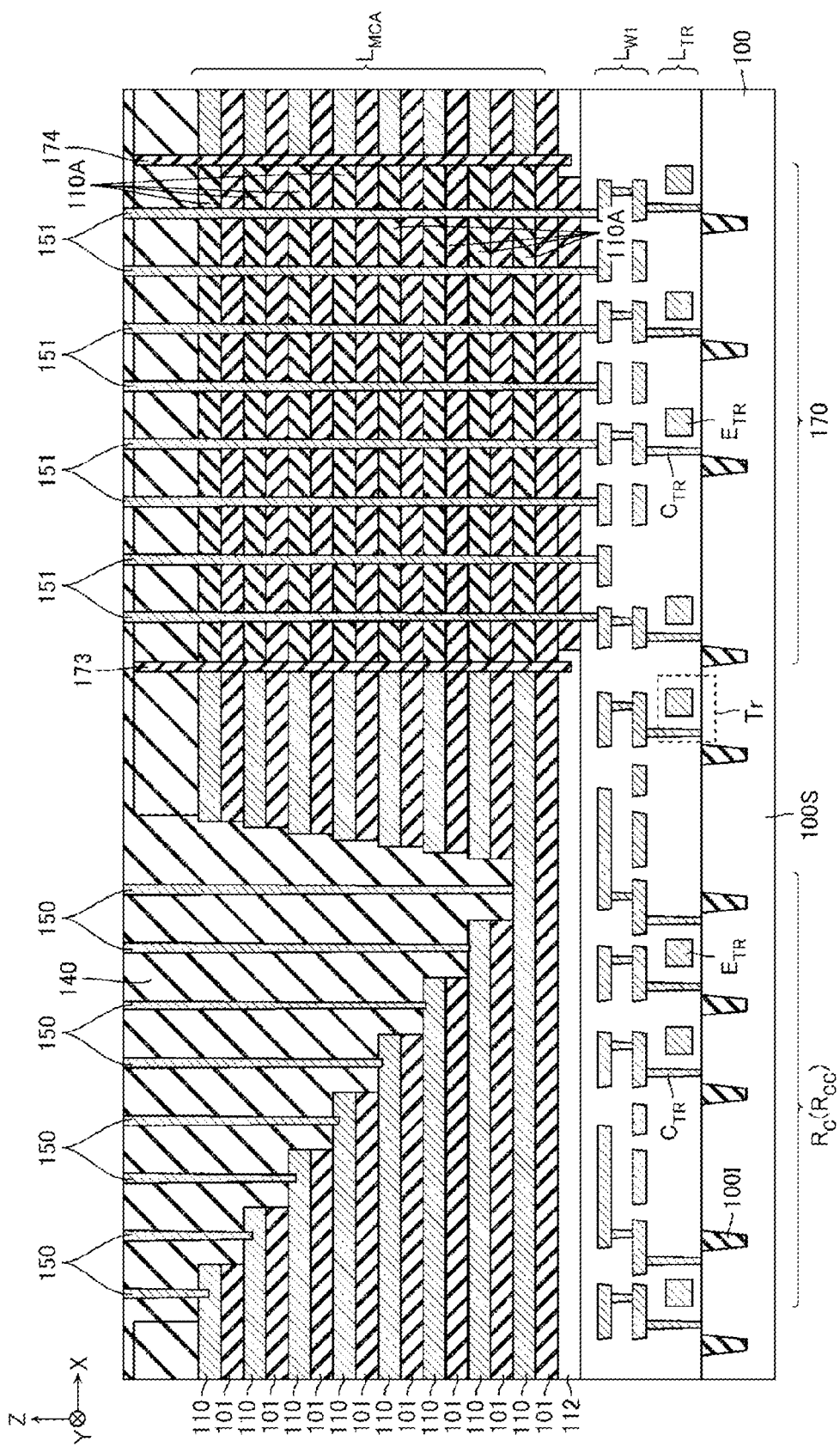
FIG. 21 illustrates a schematic X-Z cross-sectional view of a structure to illustrate the method for manufacturing the semiconductor storage device according to the first embodiment.

Seventh Step: FIGS. 20 and 21

A seventh step will be described with reference to FIGS. 20 and 21. In the seventh step, the insulating layers 160a, 160a (FIGS. 3 and 4) are formed on both side surfaces of the inter-block structure groove 160g, and the conductive layer 160b (FIGS. 3 and 4) is formed between the insulating layers 160a, 160a formed in this way to form the inter-block structure 160. Similarly, the insulating layers 161a, 161a (FIGS. 3 and 4) are formed on both side surfaces of the inter-block structure groove 161g, and the conductive layer 161b (FIGS. 3 and 4) is formed between the insulating layers 161a, 161a formed in this way to form the inter-block structure 161.

The contacts 150 are formed in the connection region $R_{CC}$ of the contact region $R_C$, and the penetrating contacts 151 are formed in the penetrating contact structure 170.

Specifically, contact holes are formed in the insulating layer 140 by, for example, RIE at positions where the contacts 150 are formed in the connection region $R_{CC}$ of the contact region $R_C$. Then, a barrier conductive film made of, for example, titanium nitride (TiN) is formed on an inner surface of this contact hole, and then each contact hole is filled with tungsten (W) or the like to form the contact 150.

In the penetrating contact structure 170, penetrating contact holes are formed in the insulating layers 101 and the insulating layers 110A by, for example, RIE at positions where the penetrating contacts 151 are formed. Then, a barrier conductive film made of, for example, titanium nitride (TiN) is formed on an inner surface of this penetrating contact hole, and then each penetrating contact hole is filled with tungsten (W) or the like to form the penetrating contact 151.

COMPARATIVE EXAMPLE

A semiconductor storage device according to a comparative example will be described with reference to FIG. 22. The depicted portion of the semiconductor storage device of comparative example in FIG. 22 corresponds, in general, to depicted portion of the semiconductor storage device of the first embodiment depicting in FIG. 3, and shows a configuration in a memory cell array layer. Certain differences between these examples will be described.

Figure 22:
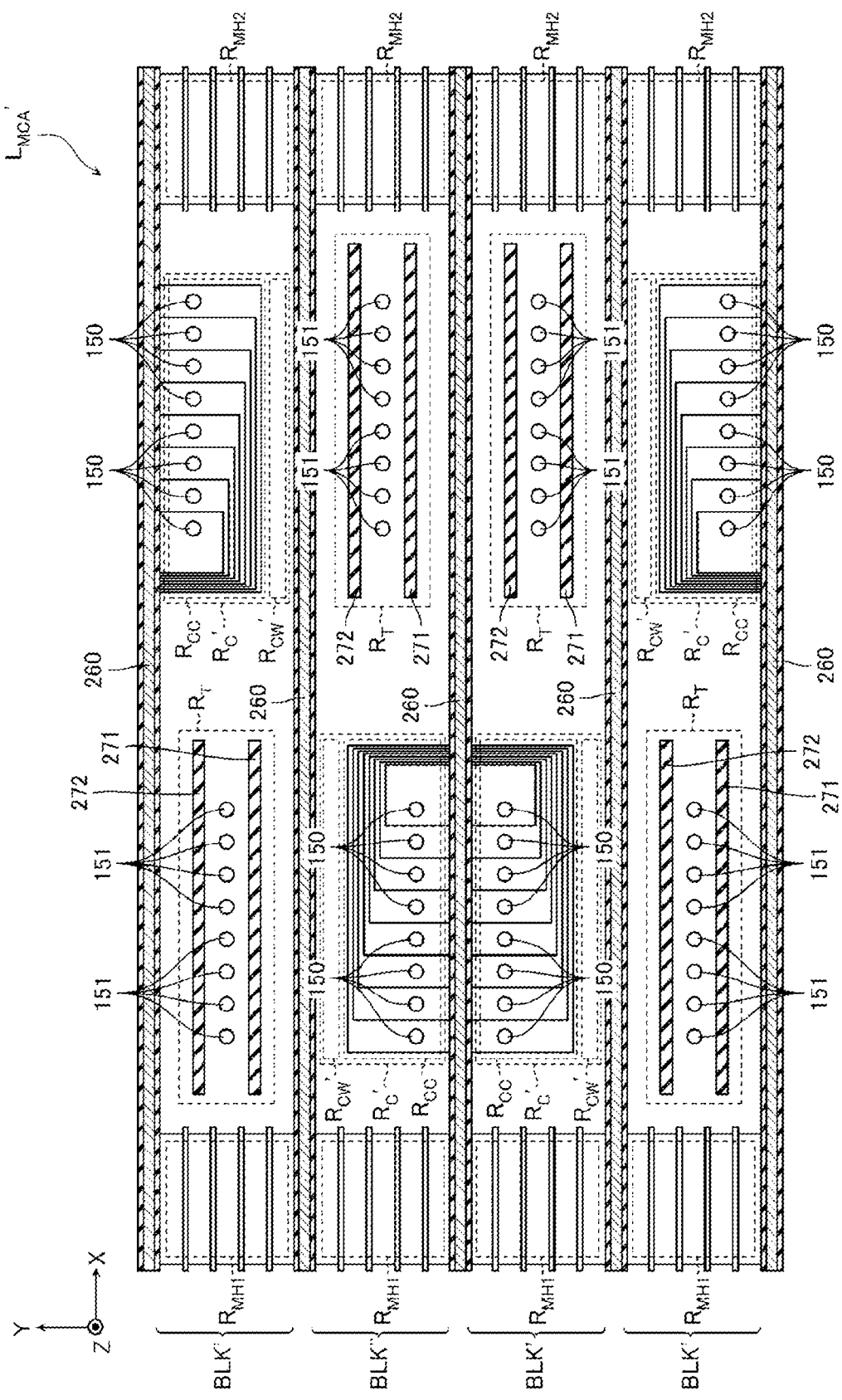
FIG. 22 illustrates a schematic enlarged cross-sectional view of a semiconductor storage device according to a comparative example.

As shown in FIG. 22, a memory cell array layer $L_{MCA}'$ in the comparative example is provided with a plurality of memory blocks BLK' arranged in the Y direction and inter-block structures 260 provided among the memory blocks BLK'. All the inter-block structures 260 extend linearly in the X direction.

The memory block BLK' includes two memory hole regions $R_{MH1}$, $R_{MH2}$ arranged in the X direction, and a contact region $R_C'$ and a penetrating contact region $R_T$ provided between the memory hole regions $R_{MH1}$, $R_{MH2}$.

In the contact region $R_C'$, a wiring region $R_{CW}'$ extending in the X direction and the connection region $R_{CC}$ extending in the X direction are provided. Here, as described above, all the inter-block structures 260 according to the comparative example extend linearly in the X direction. Therefore, a width of the wiring region $R_{CW}'$ according to the comparative example in the Y direction is smaller than a width of the wiring region $R_{CW}$ according to the first embodiment in the Y direction.

The penetrating contact region $R_T$ includes a stopper insulating layer 271 extending in the X direction and the Z direction, and a stopper insulating layer 272 extending in the X direction and the Z direction. These two stopper insulating layers 271, 272 face each other while being separated from each other in the Y direction.

The insulating layers 110A and the insulating layers 101 are alternately stacked in the Z direction between the stopper insulating layer 271 and the stopper insulating layer 272. Between the stopper insulating layer 271 and the stopper insulating layer 272, the penetrating contacts 151 penetrating the insulating layers 110A and the insulating layers 101 in the Z direction are provided side by side in the X direction.

Between the stopper insulating layer 271 and the inter-block structure 260 and between the stopper insulating layer 272 and the inter-block structure 260, the conductive layers 110 and the insulating layers 101 are alternately stacked in the Z direction.

A method of manufacturing the semiconductor storage device according to the comparative example is performed in substantially the same manner as the method of manufacturing the semiconductor storage device according to the first embodiment.

In a manufacturing process of the semiconductor storage device according to the comparative example, for example, in the replace process described with reference to FIGS. 18 and 19, entrance of the chemical solution such as phosphoric acid into the penetrating contact region $R_T$ is prevented by the stopper insulating layers 271, 272. As a result, as described above, the insulating layers 110A and the insulating layers 101 are held between the stopper insulating layers 271, 272 in a state of being alternately stacked in the Z direction. In the comparative example, the insulating layers 110A and the insulating layers 101 are used as insulating spacers between the penetrating contacts 151.

In the method of manufacturing the semiconductor storage device according to the comparative example, the insulating layers 110A are removed at both end portions of the stopper insulating layers 271, 272 in the X direction. Therefore, a length of the stopper insulating layers 271, 272 in the X direction needs to be made longer than a required length, in the X direction, of the insulating layers 110A held between the stopper insulating layers 271, 272. As a result, a length of the penetrating contact region $R_T$ in the X direction becomes long, and consequently, reduction in size of the semiconductor storage device may be inhibited.

Further, since the penetrating contact region $R_T$ is provided for each memory block BLK, it is necessary to provide all configurations in the penetrating contact regions $R_T$ between the two inter-block structures 260 adjacent to each other in the Y direction, and it is necessary to provide both the stopper insulating layers 271, 272 between the two inter-block structures 260 adjacent to each other in the Y direction. For that reason, a width of the penetrating contact region $R_T$ in the Y direction becomes large, and consequently, the reduction in size of the semiconductor storage device may be inhibited.

Further, in the comparative example, since the inter-block structure 260 extends linearly in the X direction, a width of the wiring region $R_{CW}'$ of the contact region $R_C'$ in the Y direction is small. As a result, a width, in the Y direction, of the conductive layers 110 provided in the wiring region $R_{CW}'$ becomes small, and electrical resistance thereof becomes high. For that reason, a transmission speed of a signal propagating through the conductive layers 110 may be lowered.

EFFECTS OF FIRST EMBODIMENT

In the first embodiment, in the replace process described with reference to FIGS. 18 and 19, the entrance of the chemical solution such as phosphoric acid is more reliably blocked by the rectangular cylindrical structure formed by the stopper insulating layers 171, 172, 173, 174. For that reason, the insulating layers 110A disposed inside the above-mentioned rectangular cylindrical structure are not removed by the chemical solution. As a result, the length, in the X direction, of the insulating layers 110A disposed inside the above-mentioned rectangular cylindrical structure can be set to a required length. Furthermore, in the first embodiment, the lengths, in the X direction, of the penetrating contact structure 170 including the insulating layers 110A and the stopper insulating layers 171, 172, 173, 174 can be shortened, and thus the size of the semiconductor storage device can be reduced.

In the first embodiment, one penetrating contact structure 170 is provided for each memory block set BLKS, that is, common to two memory blocks BLK. Here, in the penetrating contact structure 170 according to the first embodiment, as compared with the two penetrating contact regions $R_T$ arranged in the Y direction, a structure corresponding to the inter-block structure 260, a structure corresponding to the pair of stopper insulating layers 271, 272, and a structure of a portion provided between the inter-block structure 260 and the stopper insulating layers 271, 272 are omitted. That is, the penetrating contact structure 170 according to the first embodiment has a width in the Y direction smaller than that of the structure according to the comparative example. As a result, the size of the semiconductor storage device can be reduced.

The penetrating contact structure 170 according to the first embodiment has a width in the Y direction smaller than that of the structure according to the comparative example. For that reason, it is possible to sufficiently increase a width, in the Y direction, of the wiring region $R_W$ adjacent to the penetrating contact structure 170 in the Y direction. As a result, by adjusting the positions, in the Y direction, of the above-mentioned portions $160_{C-W}$ of the inter-block structure 160 provided between the wiring region $R_W$ and the wiring region $R_{CW}$, the widths of both the wiring region $R_W$ and the wiring region $R_{CW}$ in the Y direction can be increased. Accordingly, the electrical resistance of the conductive layers 110 provided in the wiring region $R_{CW}$ can be reduced, and the transmission speed of the signal propagating through each conductive layer 110 can be maintained high.

OTHER EMBODIMENTS

Here, other examples of the structures of the stopper insulating layers 171, 172, 173, 174 and the like of the penetrating contact structure 170 and a connection state between the penetrating contact structure 170 and the inter-block structure 161 shown in the first embodiment will be described.

Figure 23:
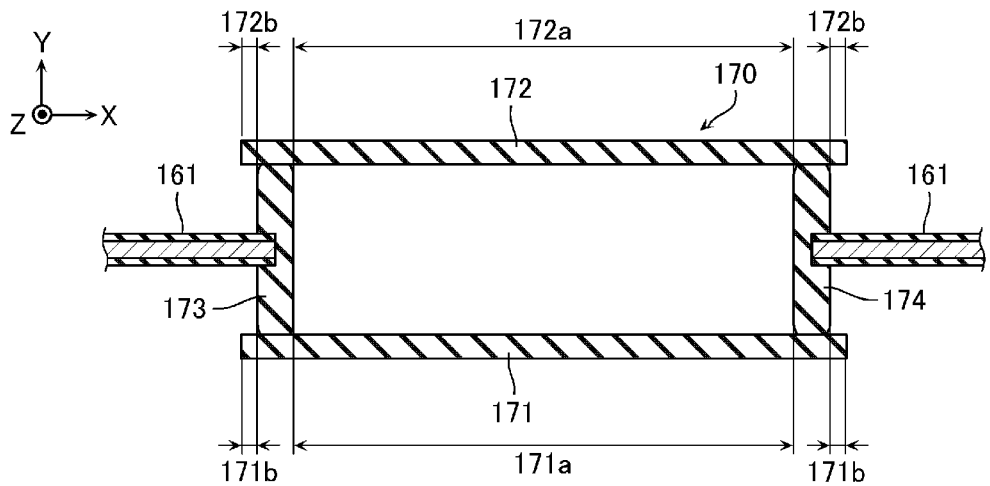
FIG. 23 illustrates a schematic plan view of a penetrating contact structure of a semiconductor storage device according to a modification example.

In the example shown in FIG. 23, the stopper insulating layers 171, 172 include portions 171a, 172a positioned between disposing positions of the stopper insulating layers 173, 174 in the X direction, and portions 171b, 172b positioned outside the disposing positions of the stopper insulating layers 173, 174 in the X direction.

Figure 24:
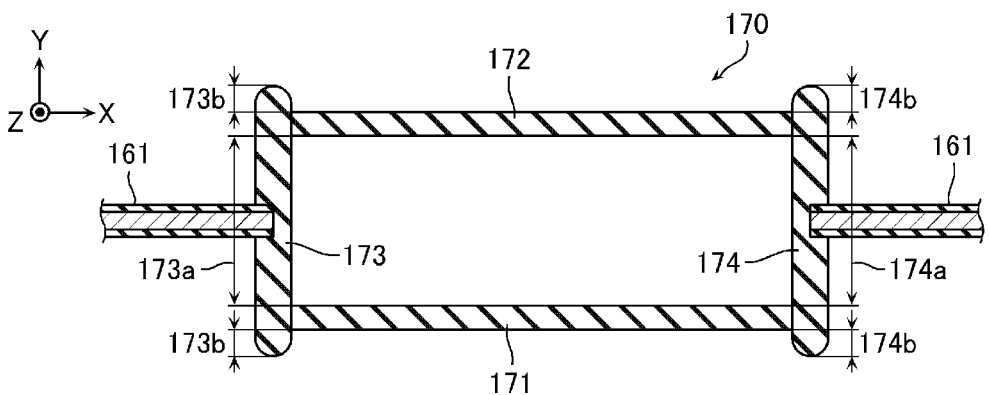
FIG. 24 illustrates a schematic plan view of a penetrating contact structure of the semiconductor storage device according to the modification example.

In the example shown in FIG. 24, the stopper insulating layers 173, 174 include portions 173a, 174a positioned between disposing positions of the stopper insulating layers 171, 172 in the Y direction, and portions 173b, 174b positioned outside the disposing positions of the stopper insulating layers 171, 172 in the Y direction.

Figure 25:
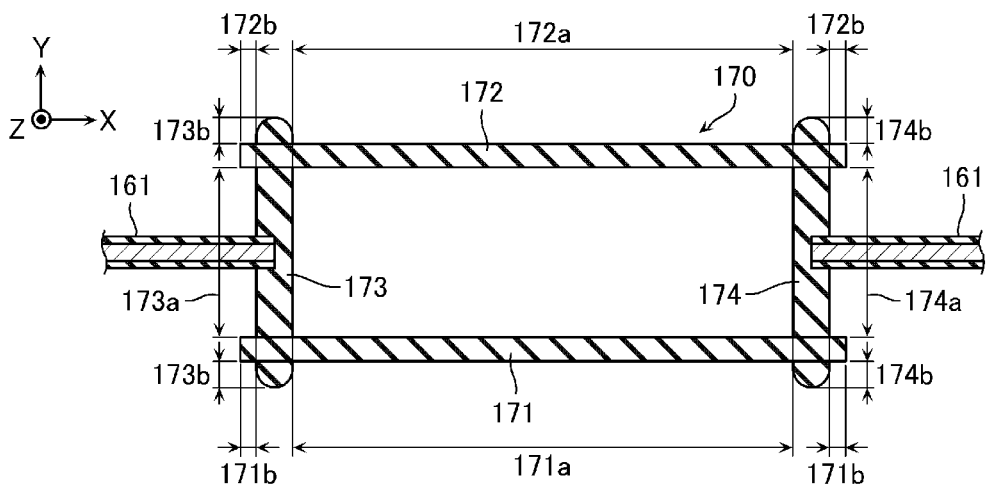
FIG. 25 illustrates a schematic plan view of a penetrating contact structure of the semiconductor storage device according to the modification example.

In the example shown in FIG. 25, the stopper insulating layers 171, 172 include the above-mentioned portions 171a, 172a, 171b, 172b. The stopper insulating layers 173, 174 include the above-mentioned portions 173a, 174a, 173b, 174b.

Figure 26:
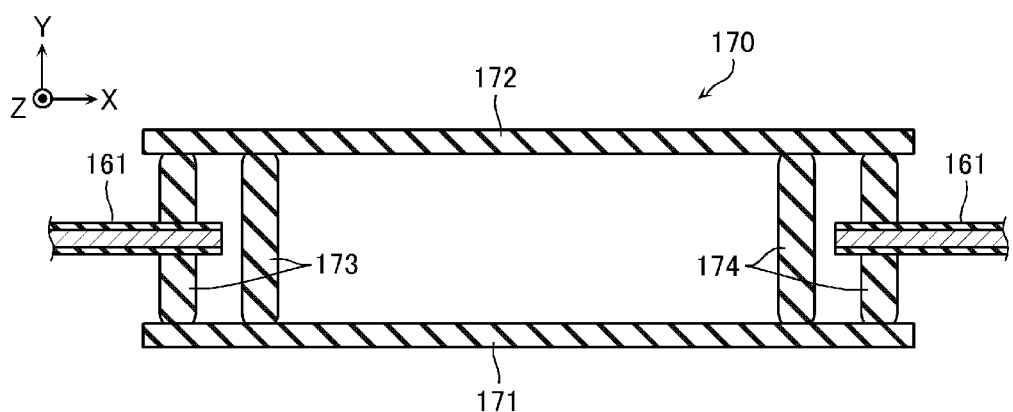
FIG. 26 illustrates a schematic plan view of a penetrating contact structure of the semiconductor storage device according to the modification example.

In the example shown in FIG. 26, two stopper insulating layers 173 arranged in the X direction are provided on one side (left side in FIG. 26), in the X direction, of the plurality of penetrating contacts 151 provided in the penetrating contact structure 170. Two stopper insulating layers 174 arranged in the X direction are provided on the other side (right side in FIG. 26), in the X direction, of the plurality of penetrating contacts 151 provided in the penetrating contact structure 170. The two stopper insulating layers 173 and the two stopper insulating layers 174 are connected to the stopper insulating layers 171, 172, respectively. In the example shown in FIG. 26, the inter-block structure 161 on one side (left side in FIG. 26) in the X direction penetrates one stopper insulating layer 173, and the inter-block structure 161 on the other side (right side in FIG. 26) in the X direction penetrates one stopper insulating layer 174.

Figure 27:
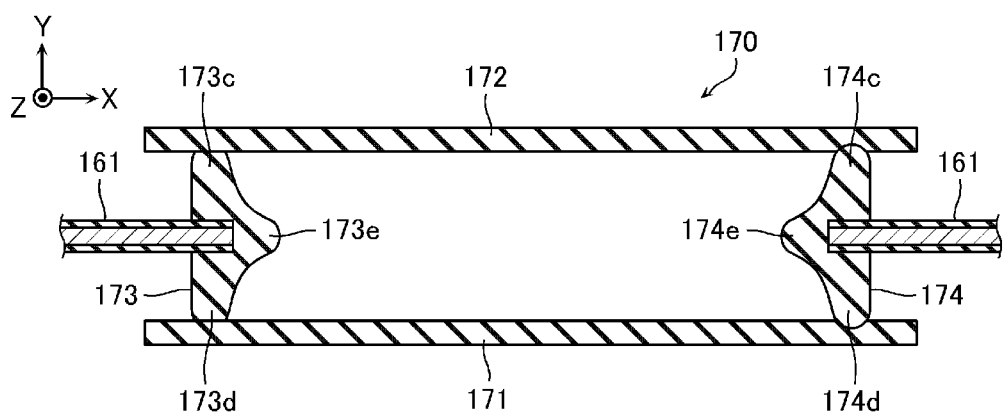
FIG. 27 illustrates a schematic plan view of a penetrating contact structure of the semiconductor storage device according to the modification example.

In the example shown in FIG. 27, the stopper insulating layer 173 includes a portion 173c provided at one end portion in the Y direction, a portion 173d provided at the other end portion in the Y direction, and a portion 173e provided between the portion 173c and the portion 173d. A width of the portion 173e in the X direction is larger than widths of the portions 173c, 173d in the X direction. In the example shown in FIG. 27, the stopper insulating layer 174 includes a portion 174c provided at one end portion in the Y direction, a portion 174d provided at the other end portion in the Y direction, and a portion 174e provided between the portion 174c and the portion 174d. A width of the portion 174e in the X direction is larger than widths of the portions 174c, 174d in the X direction. In the example of FIG. 27, the end portion of the inter-block structure 161 on one side (left side in FIG. 27) in the X direction is fitted into the above-mentioned portion 173e of the stopper insulating layer 173, and the end portion of the inter-block structure 161 on the other side (right side in FIG. 27) is fitted into the above-mentioned portion 174e of the stopper insulating layer 174.

OTHERS

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device, comprising:
a semiconductor substrate; and
a memory cell array on the semiconductor substrate, the memory cell array being spaced from a surface of the semiconductor substrate in a first direction and including a first region, a second region, and a third region arranged in this order along a second direction parallel to the surface of the semiconductor substrate, wherein the memory cell array comprises:
    a first stack including a plurality of first conductive layers and a plurality of first insulating layers alternately stacked in the first direction in the first and third regions;
    a first semiconductor layer extending through the first stack in the first direction in the first region;
    a second semiconductor layer extending through the first stack in the first direction in the third region;
    a second stack including a plurality of second insulating layers and a plurality of third insulating layers alternately stacked in the first direction in the second region;
    a first contact extending through the second stack in the first direction in the second region, a lower end of the first contact being closer to the semiconductor substrate than is a lower end of the first stack, and an upper end of the first contact being farther from the semiconductor substrate than is an upper end of the first stack;
    a fourth insulating layer extending in the first and second directions in the second region and adjacent to a first side surface of the second stack facing a third direction parallel to the surface of the semiconductor substrate; and
    a fifth insulating layer extending in the first and third directions in the second region and adjacent to a second side surface of the second stack facing the second direction, a first distance from a bottom end of the fourth insulating layer to the semiconductor substrate being different from a second distance from a bottom end of the fifth insulating layer to the semiconductor substrate,
    wherein a width of the fourth insulating layer in the third direction at a layer level in the first direction that is aligned with one of the second insulating layers is different from a width of the fifth insulating layer in the second direction at the layer level in the first direction.

2. The semiconductor storage device according to claim 1, wherein the first distance is greater than the second distance.

3. The semiconductor storage device according to claim 1, wherein the first distance is less than the second distance.

4. The semiconductor storage device according to claim 1, wherein the width of the fourth insulating layer in the third direction at the layer level in the first direction is less than the width of the fifth insulating layer in the second direction at the layer level in the first direction.

5. The semiconductor storage device according to claim 1, wherein the memory cell array further comprises:

a sixth insulating layer extending in the first and second directions in the second region and adjacent to a third side surface of the second stack facing the third direction, the third side surface being opposite to the first side surface.

6. The semiconductor storage device according to claim 5, wherein the memory cell array further comprises:
a seventh insulating layer extending in the first and third directions in the second region and adjacent to a fourth side surface of the second stack facing the second direction, the fourth side surface being opposite to the second side surface.

7. The semiconductor storage device according to claim 6, wherein the memory cell array further comprises:
an eighth insulating layer extending in the first and third directions through the second stack in the second region in parallel to the fifth insulating layer and the seventh insulating layer.

8. The semiconductor storage device according to claim 1, wherein the fifth insulating layer includes a protrusion protruding in the third direction into the second stack.

9. The semiconductor storage device according to claim 1, wherein the fifth insulating layer extends in the third direction beyond an end of the first stack in the third direction.

10. The semiconductor storage device according to claim 1, wherein
the memory cell array further includes a fourth region between the first region and the second region, and
the memory cell array further comprises:
a plurality of second contacts extending in the first direction in the fourth region, the plurality of second contacts being electrically connected to the plurality of first conductive layers, respectively; and
ninth and tenth insulating layers that extend in the first and second directions, and between which the first and fourth regions are located, wherein a distance between the ninth and tenth insulating layers in the third direction at the first region is less than a distance between the ninth and tenth insulating layers in the third direction at the fourth region.

11. A semiconductor storage device comprising:
a semiconductor substrate; and
a memory cell array on the semiconductor substrate, the memory cell array being spaced from a surface of the semiconductor substrate in a first direction, the memory cell array including first and second memory hole regions arranged along a second direction parallel to the surface of the semiconductor substrate and a penetrating contact region between the first and second memory hole regions, wherein
the memory cell array comprises:
a first stack including a plurality of first conductive layers and a plurality of first insulating layers alternately stacked in the first direction in the first and second memory hole regions;
a first semiconductor pillar extending through the first stack in the first direction in the first memory hole region;
a second semiconductor pillar extending through the first stack in the first direction in the second memory hole region;
a second stack including a plurality of second insulating layers and a plurality of third insulating layers alternately stacked in the first direction in the penetrating contact region;
a first contact extending through the second stack in the first direction in the penetrating contact region, a lower end of the first contact being closer to the semiconductor substrate than is a lower end of the first stack, and an upper end of the first contact being farther from the semiconductor substrate than is an upper end of the first stack;
a first stopper insulating layer extending in the first and second directions in the penetrating contact region and adjacent to a first side surface of the second stack facing a third direction parallel to the surface of the semiconductor substrate; and
a second stopper insulating layer extending in the first and third directions in the penetrating contact region and adjacent to a second side surface of the second stack facing the second direction, a first distance from a bottom end of the first stopper insulating layer to the semiconductor substrate being different from a second distance from a bottom end of the second stopper insulating layer to the semiconductor substrate,
wherein a width of the first stopper insulating layer in the third direction at a layer level in the first direction that is aligned with one of the second insulating layers is different from a width of the second stopper insulating layer in the second direction at the layer level in the first direction.

12. The semiconductor storage device according to claim 11, wherein the first distance is greater than the second distance.

13. The semiconductor storage device according to claim 11, wherein the first distance is less than the second distance.

14. The semiconductor storage device according to claim 11, wherein the width of the first stopper insulating layer in the third direction at the layer level in the first direction is less than the width of the second stopper insulating layer in the second direction at the layer level in the first direction.

15. The semiconductor storage device according to claim 11, wherein the memory cell array further comprises:
a third stopper insulating layer extending in the first and second directions in the penetrating contact region and adjacent to a third side surface of the second stack facing the third direction, the third side surface being opposite to the first side surface.

16. The semiconductor storage device according to claim 15, wherein the memory cell array further comprises:
a fourth stopper insulating layer extending in the first and third directions in the penetrating contact region and adjacent to a fourth side surface of the second stack facing the second direction, the fourth side surface being opposite to the second side surface.

17. The semiconductor storage device according to claim 16, wherein the memory cell array further comprises:
a fifth stopper insulating layer extending in the first and third directions through the second stack in the second region in parallel to the second and fourth stopper insulating layers.

18. The semiconductor storage device according to claim 11, wherein the second stopper insulating layer includes a protrusion protruding in the third direction into the second stack.

19. The semiconductor storage device according to claim 11, wherein the second stopper insulating layer extends in the third direction beyond an end of the first stack in the third direction.

20. The semiconductor storage device according to claim 11, wherein the memory cell array further includes a contact region between the first memory hole region and the penetrating contact region, the memory cell array further comprises:
- a plurality of second contacts extending in the first direction in the contact region, the plurality of second contacts being electrically connected to the plurality of first conductive layers, respectively; and
- first and second inter-block structures that extend in the first and second directions, and between which the first memory hole region and the contact region are located, wherein a distance between the first and second inter-block structures in the third direction at the first memory hole region is less than a distance between the first and second inter-block structures in the third direction at the contact region.

* * * * *